United States Patent
Chen

(10) Patent No.: US 11,114,336 B2
(45) Date of Patent: Sep. 7, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Huang-Kui Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 72 days.

(21) Appl. No.: 16/689,446

(22) Filed: Nov. 20, 2019

(65) Prior Publication Data

US 2020/0176309 A1 Jun. 4, 2020

Related U.S. Application Data

(60) Provisional application No. 62/773,941, filed on Nov. 30, 2018.

(51) Int. Cl.
*H01L 21/76* (2006.01)
*H01L 29/78* (2006.01)
(Continued)

(52) U.S. Cl.
CPC .. *H01L 21/76844* (2013.01); *H01L 21/76802* (2013.01); *H01L 23/5226* (2013.01);
(Continued)

(58) Field of Classification Search
CPC ......... H01L 21/76844; H01L 21/76802; H01L 23/5226; H01L 29/401; H01L 23/53266; H01L 29/785; H01L 29/66795; H01L 29/41791; H01L 21/76825; H01L 21/76883; H01L 23/5329; H01L 23/485;
(Continued)

(56) References Cited

U.S. PATENT DOCUMENTS 9,559,051 B1 1/2017 Xin et al.
9,837,309 B2 12/2017 Clevenger et al.
(Continued)

FOREIGN PATENT DOCUMENTS

CN 102969233 A 3/2013
TW 201351653 A 12/2013
TW 201839906 A 11/2018

*Primary Examiner* — Sheikh Maruf
(74) *Attorney, Agent, or Firm* — McDermott Will & Emery LLP

(57) ABSTRACT

In a method of manufacturing a semiconductor device, a first source/drain structure is formed over a substrate, one or more first insulating layers are formed over the first source/drain structure, a first opening is formed in the one or more first insulating layers, the first opening is filled with a first conductive material to form a first lower contact in contact with the first source/drain structure, one or more second insulating layers are formed over the first lower contact, a second opening is formed in the one or more second insulating layers to at least partially expose the first lower contact, a first liner layer is formed on at least a part of an inner side face of the second opening, and the second opening is filled with a second conductive material to form a first upper contact in contact with the first lower contact without the first liner layer.

20 Claims, 22 Drawing Sheets

(51) Int. Cl.
*H01L 21/768* (2006.01)
*H01L 23/522* (2006.01)
*H01L 29/40* (2006.01)
*H01L 23/532* (2006.01)
*H01L 29/66* (2006.01)

(52) U.S. Cl.
CPC ...... H01L 23/53266 (2013.01); H01L 29/401 (2013.01); H01L 29/66795 (2013.01); H01L 29/785 (2013.01)

(58) Field of Classification Search
CPC ......... H01L 21/76805; H01L 21/76897; H01L 29/41725; H01L 29/66515; H01L 29/78
USPC .............................................. 257/213; 438/75
See application file for complete search history.

(56) References Cited

U.S. PATENT DOCUMENTS

| | | | |
|---|---|---|---|
| 2003/0089928 A1* | 5/2003 | Saito | H01L 21/76834 257/213 |
| 2006/0043429 A1* | 3/2006 | Huglin | H01L 21/76843 257/213 |
| 2008/0012142 A1* | 1/2008 | Mehta | H01L 23/5226 257/762 |
| 2008/0173901 A1* | 7/2008 | Zhu | H01L 21/823807 257/213 |
| 2009/0098728 A1* | 4/2009 | Grunow | H01L 21/76805 438/629 |
| 2010/0213547 A1* | 8/2010 | He | H01L 29/127 257/347 |
| 2011/0006429 A1* | 1/2011 | Liu | H01L 21/76831 257/751 |
| 2012/0068344 A1* | 3/2012 | Bonilla | H01L 21/28562 257/752 |
| 2016/0027738 A1* | 1/2016 | Murray | H01L 23/53223 257/751 |
| 2016/0336264 A1* | 11/2016 | Rullan | H01L 21/76811 |
| 2017/0148673 A1* | 5/2017 | Clevenger | H01L 21/76844 |
| 2018/0102364 A1* | 4/2018 | Rastogi | H01L 23/535 |
| 2018/0190809 A1* | 7/2018 | Huang | H01L 27/0886 |

\* cited by examiner

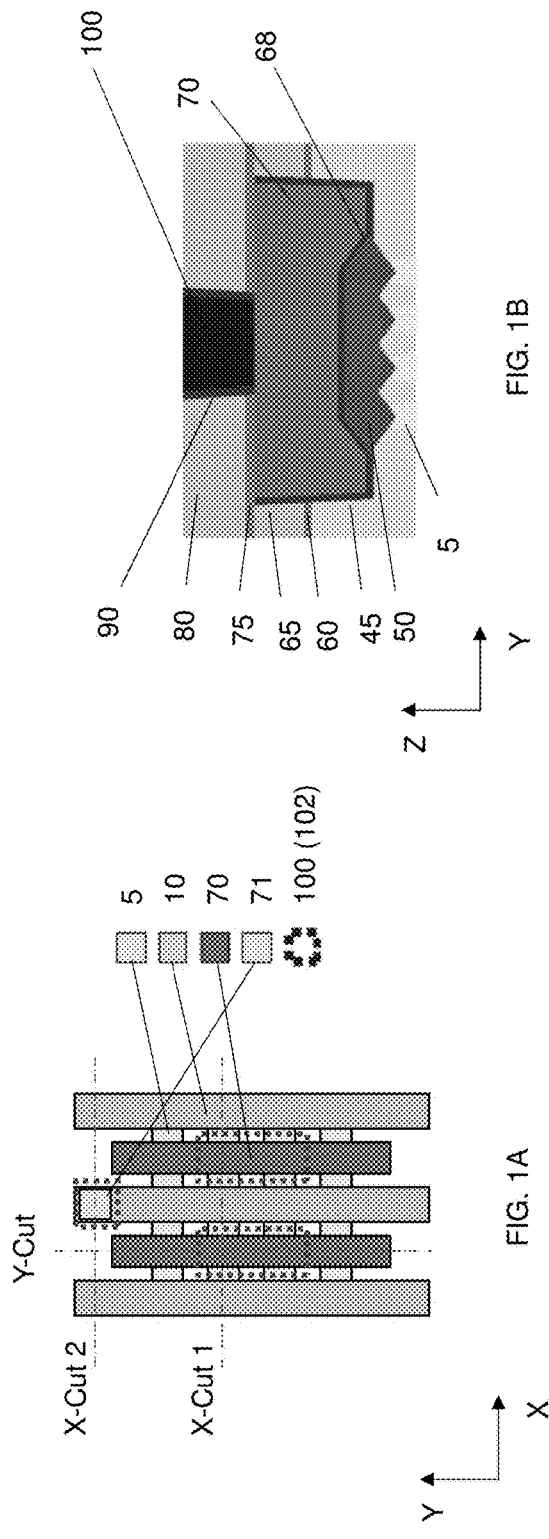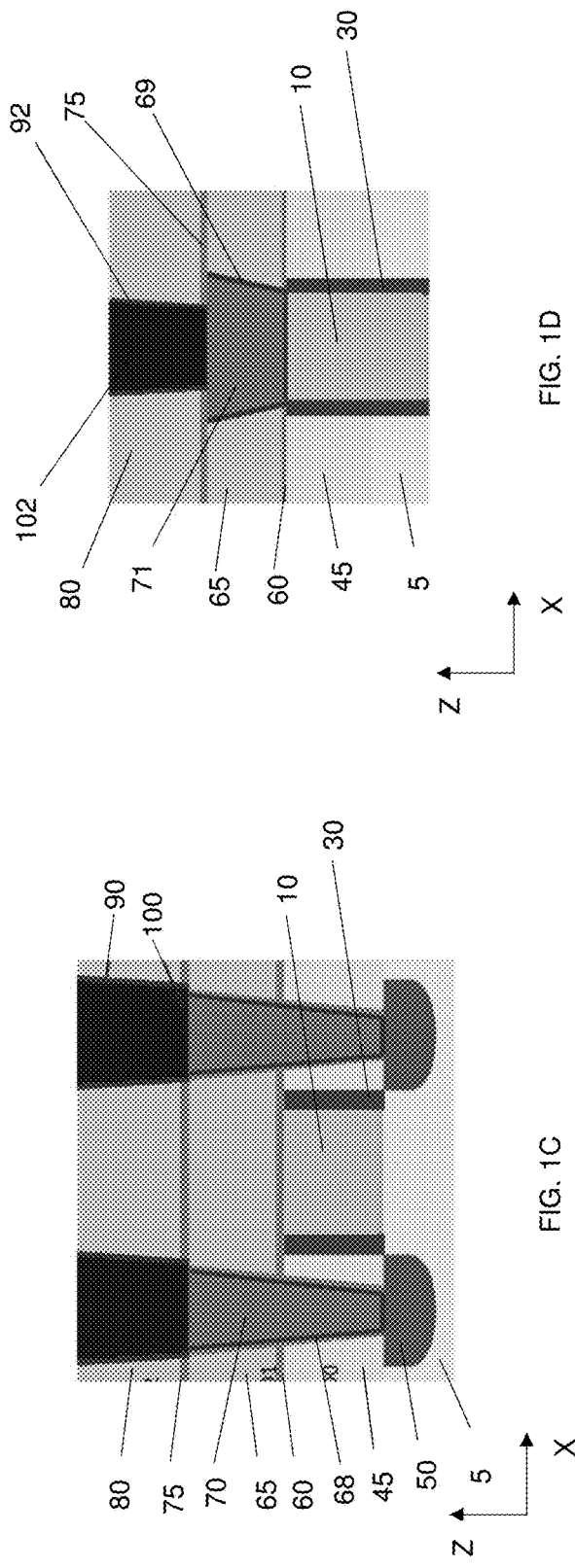

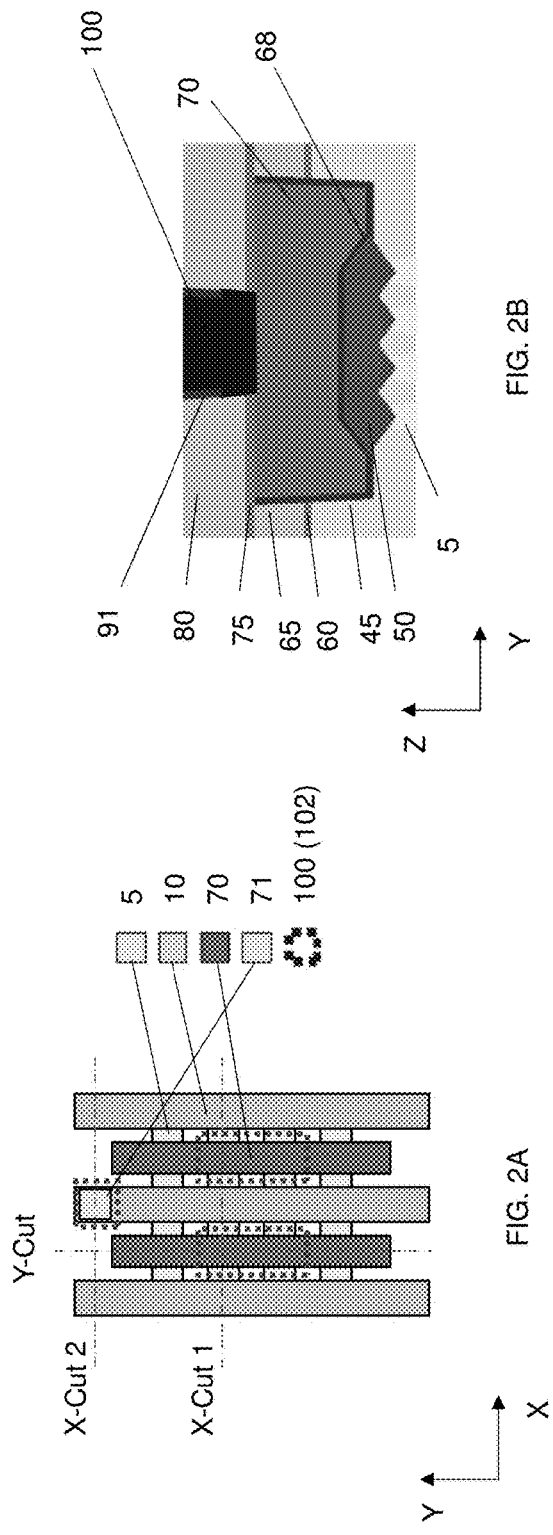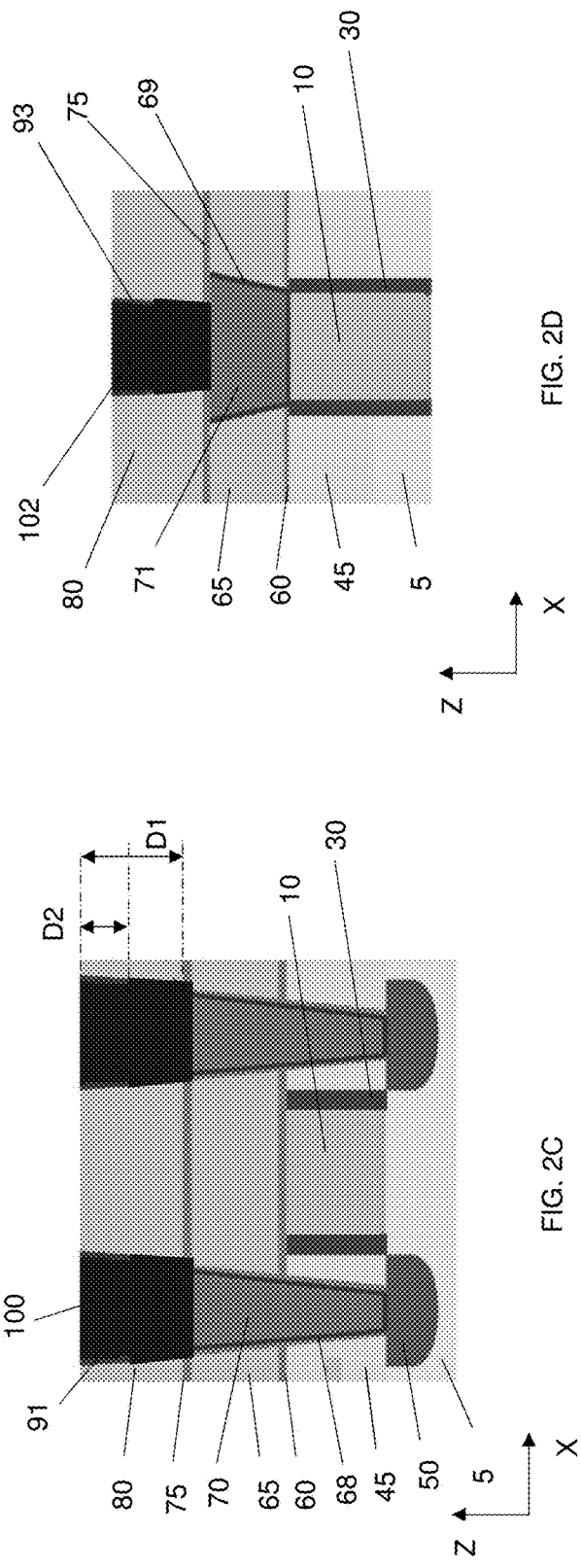

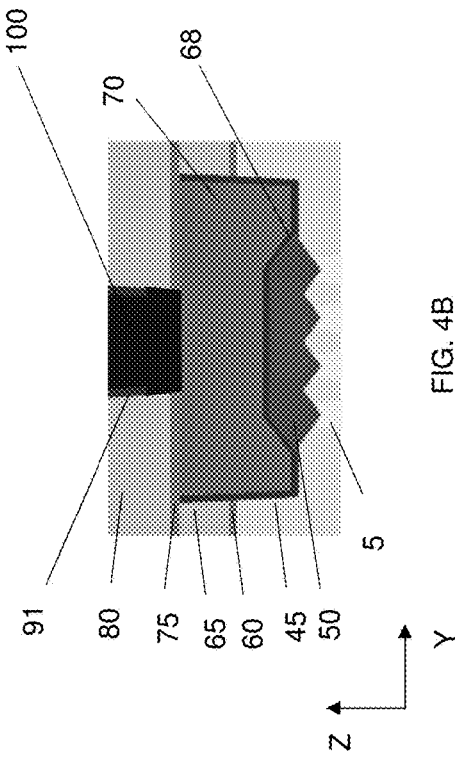
FIG. 4A
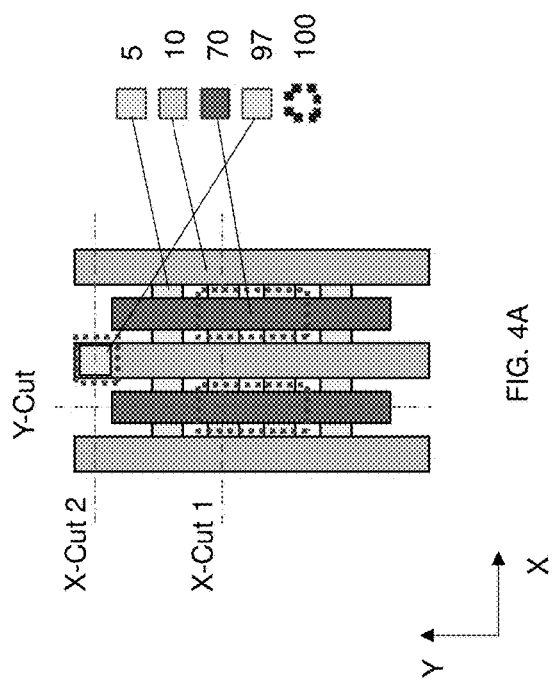
FIG. 4B
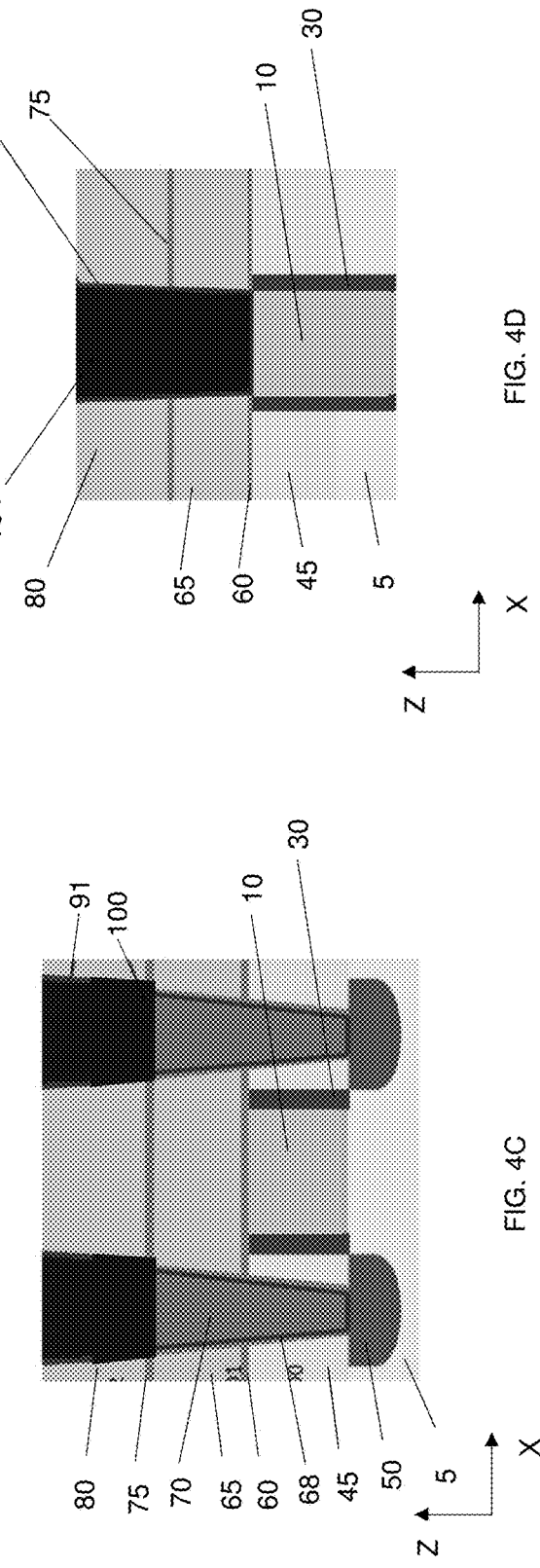
FIG. 4C
FIG. 4D

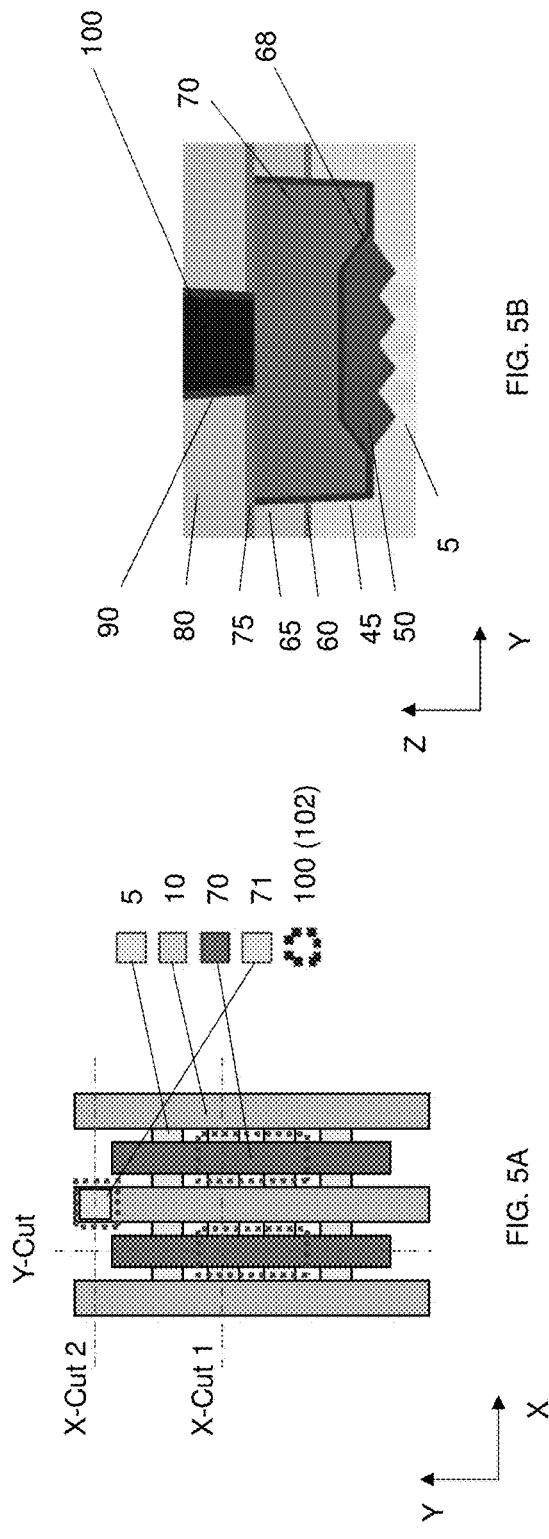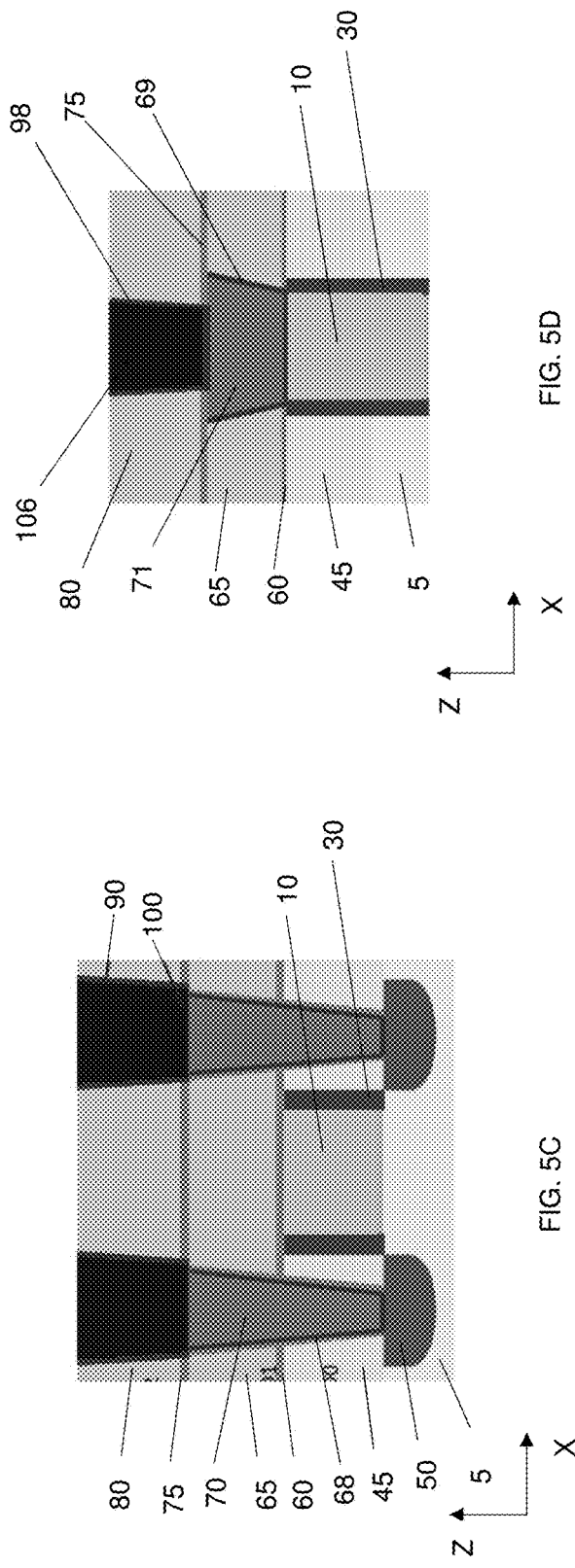
FIG. 5A
FIG. 5B
FIG. 5C
FIG. 5D

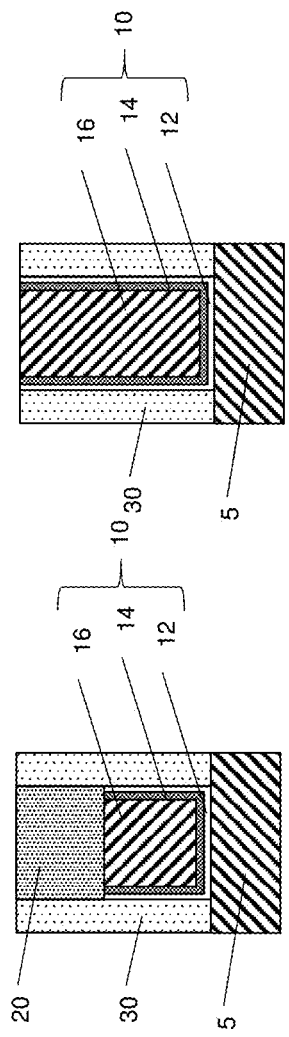
FIG. 6C
FIG. 6D
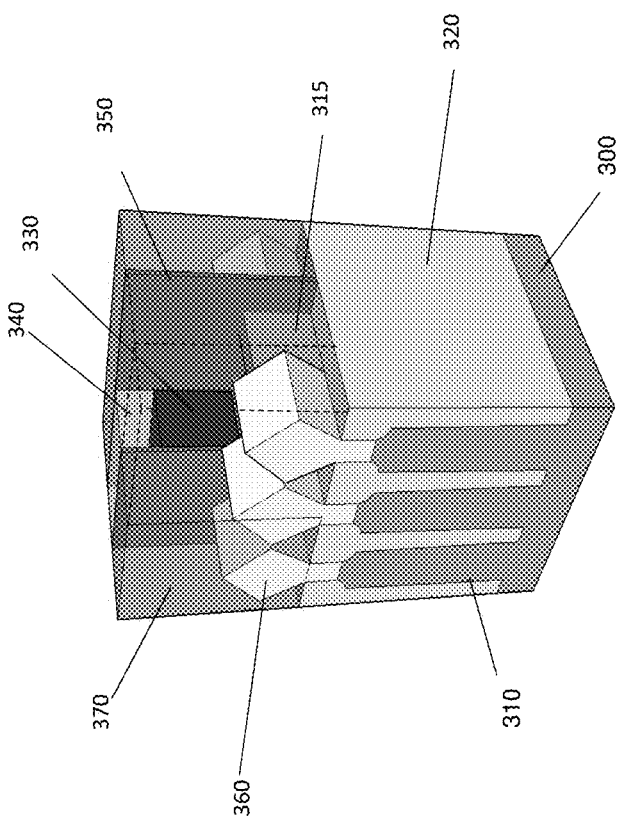
FIG. 6E

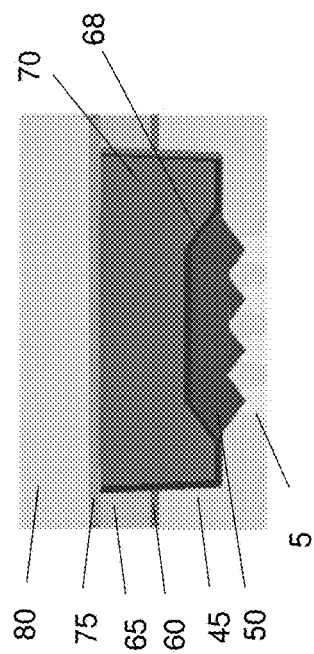
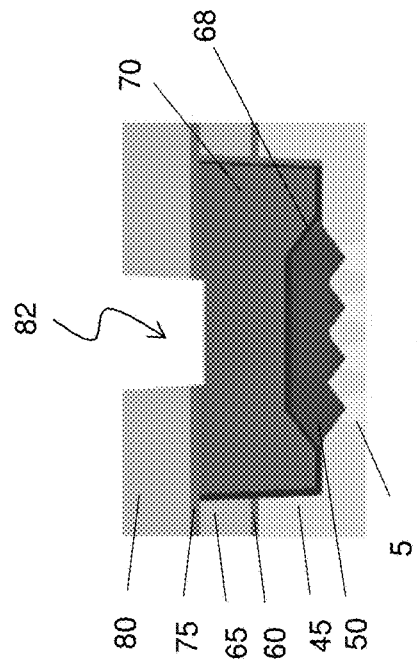
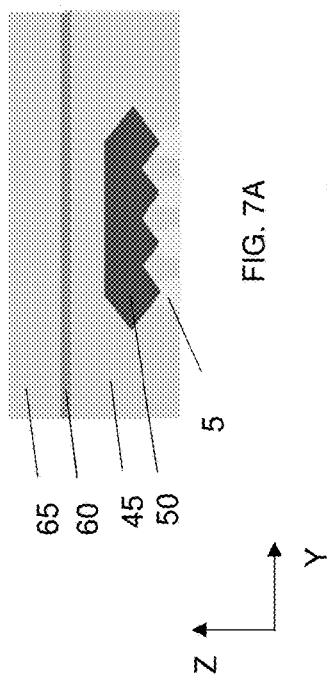
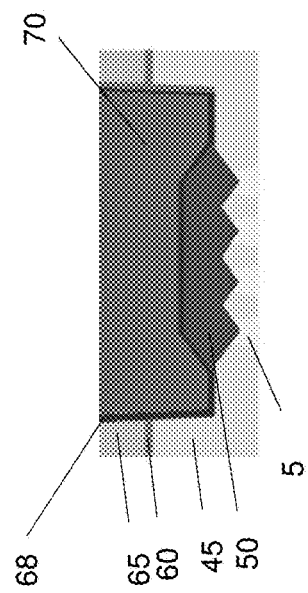

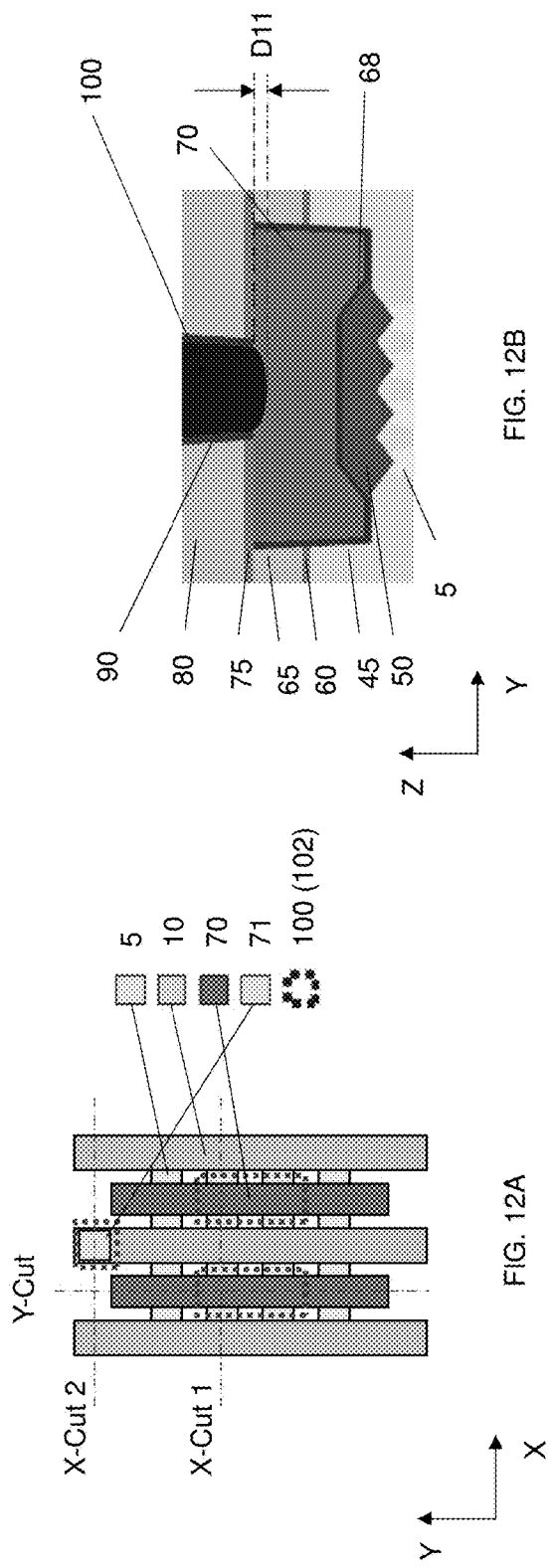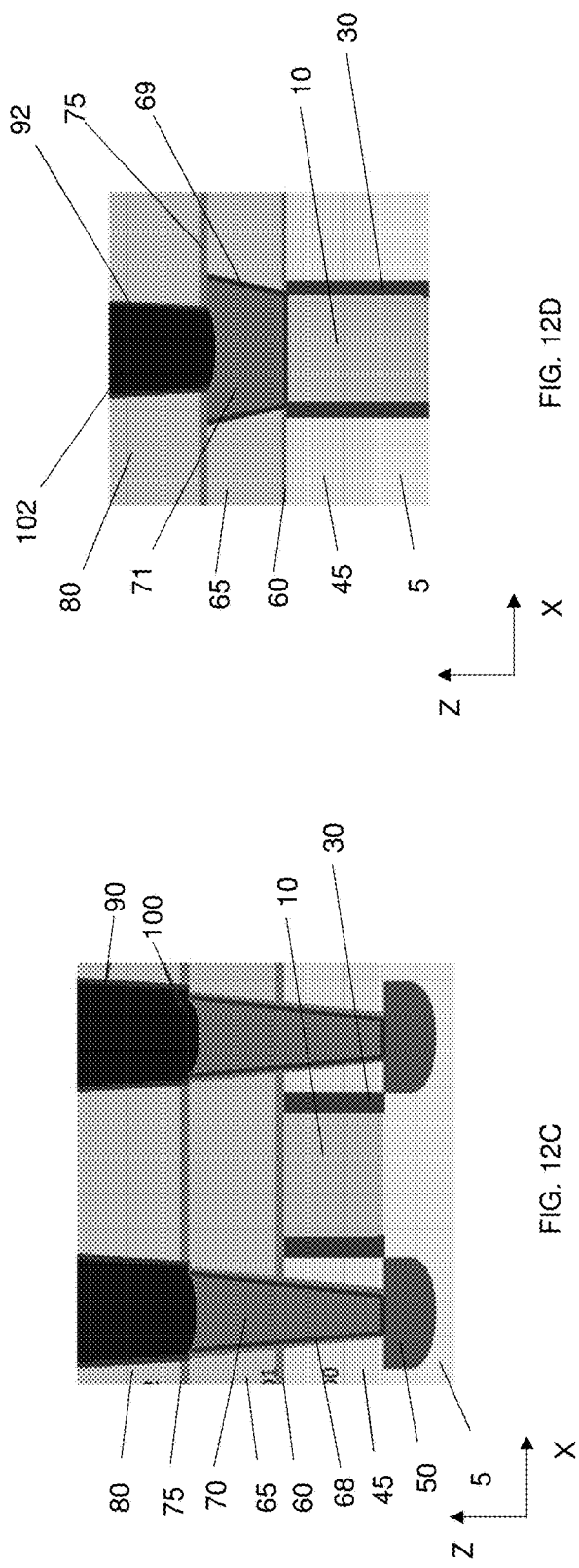
FIG. 12A
FIG. 12B
FIG. 12C
FIG. 12D

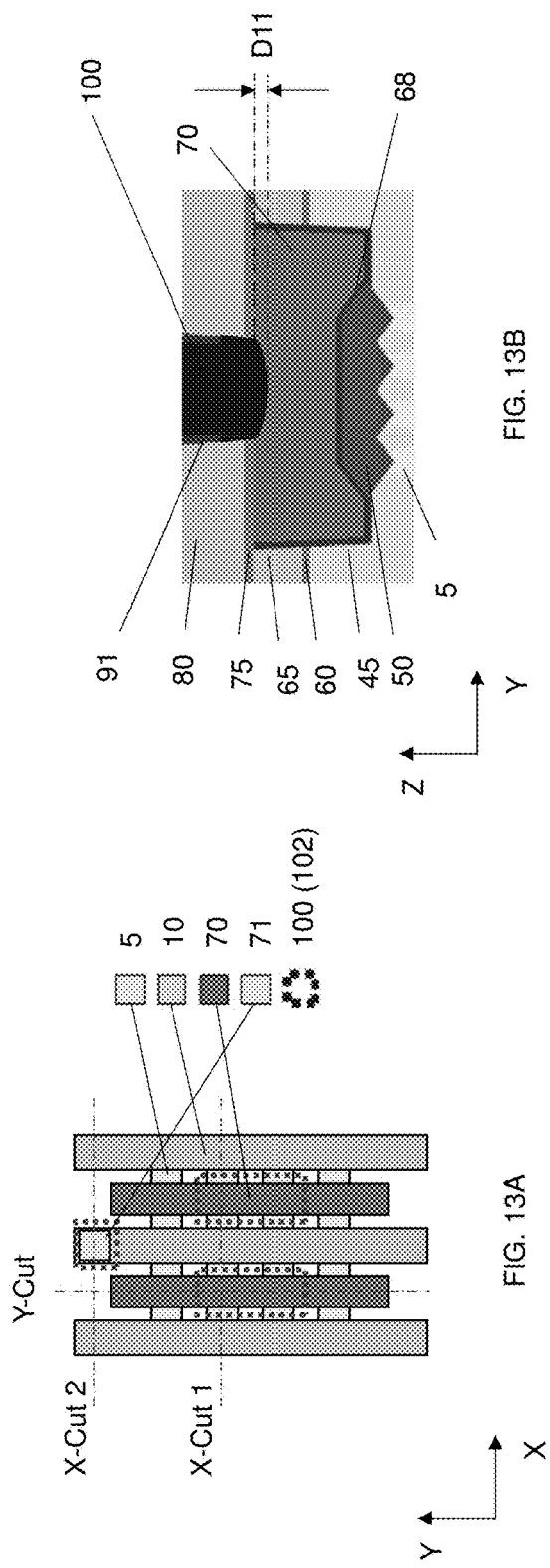
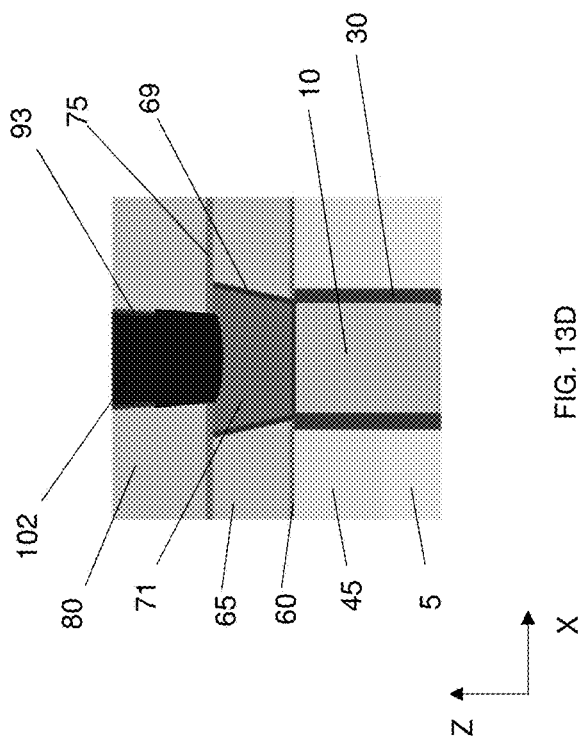
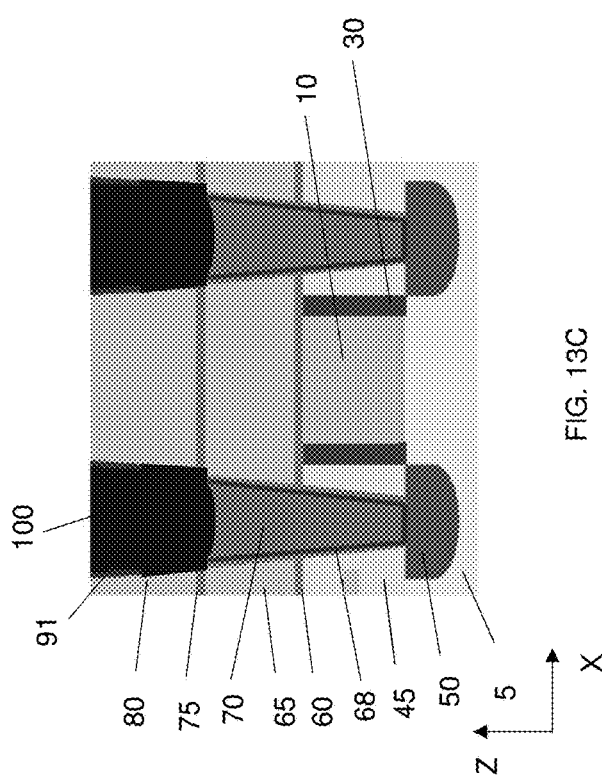
FIG. 13A
FIG. 13B
FIG. 13C
FIG. 13D

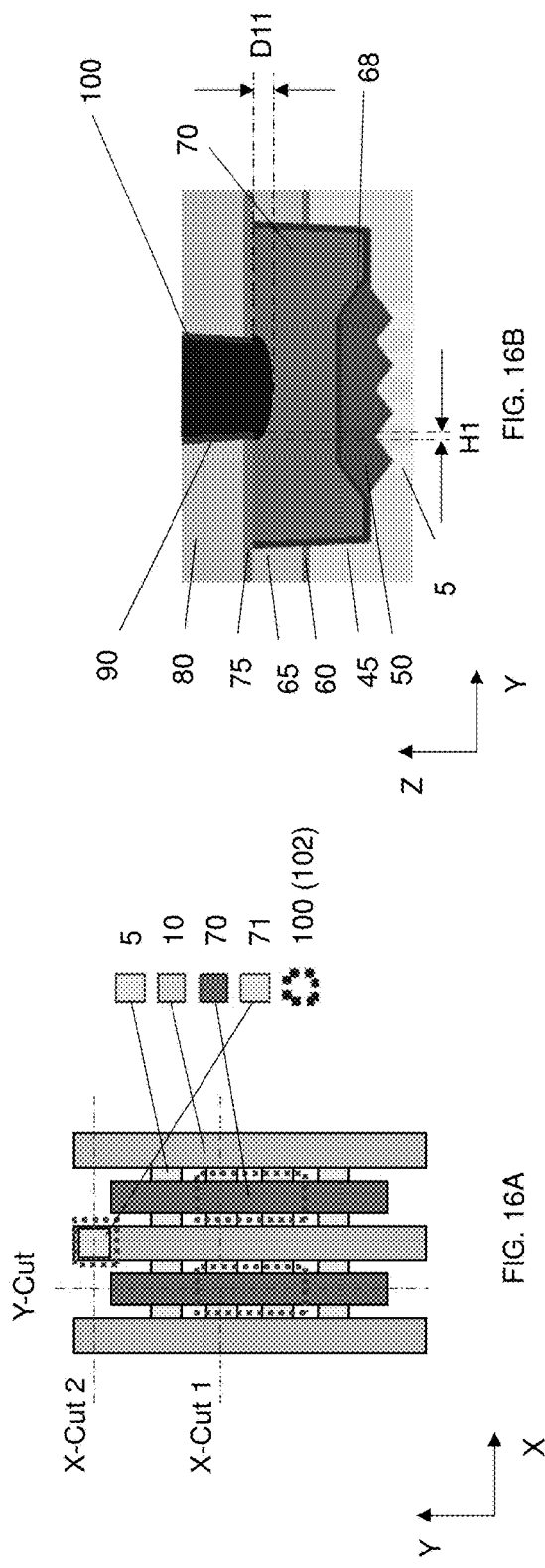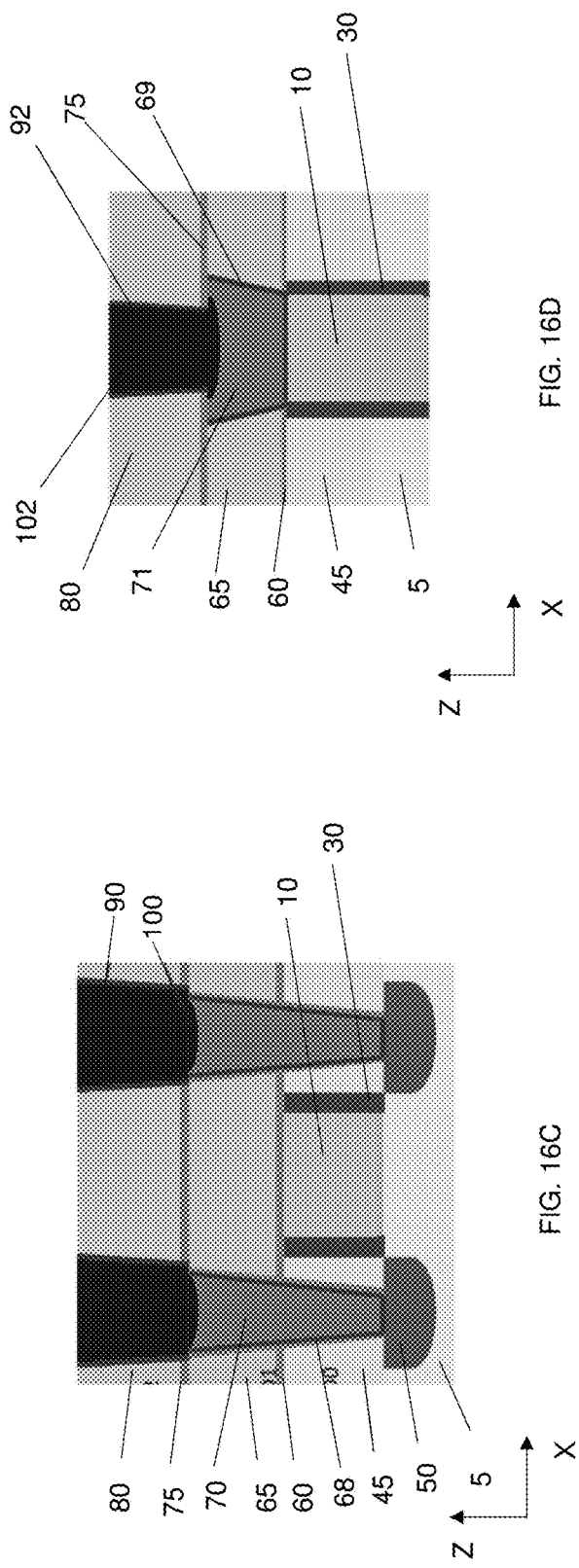

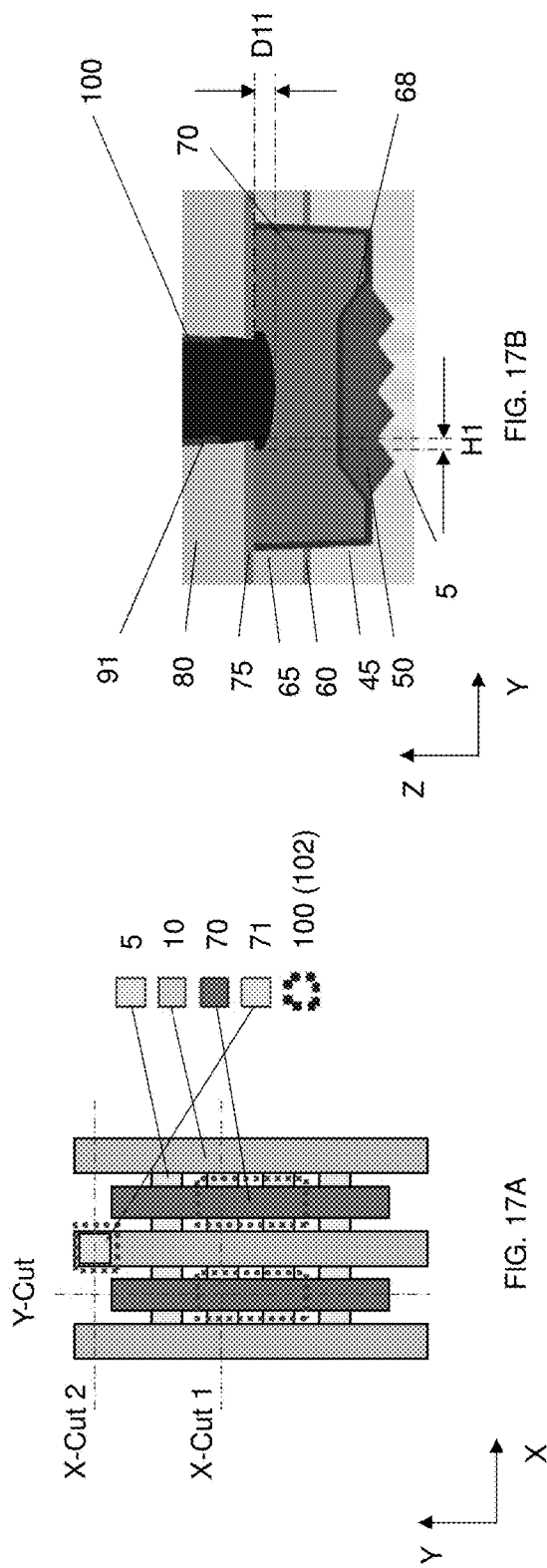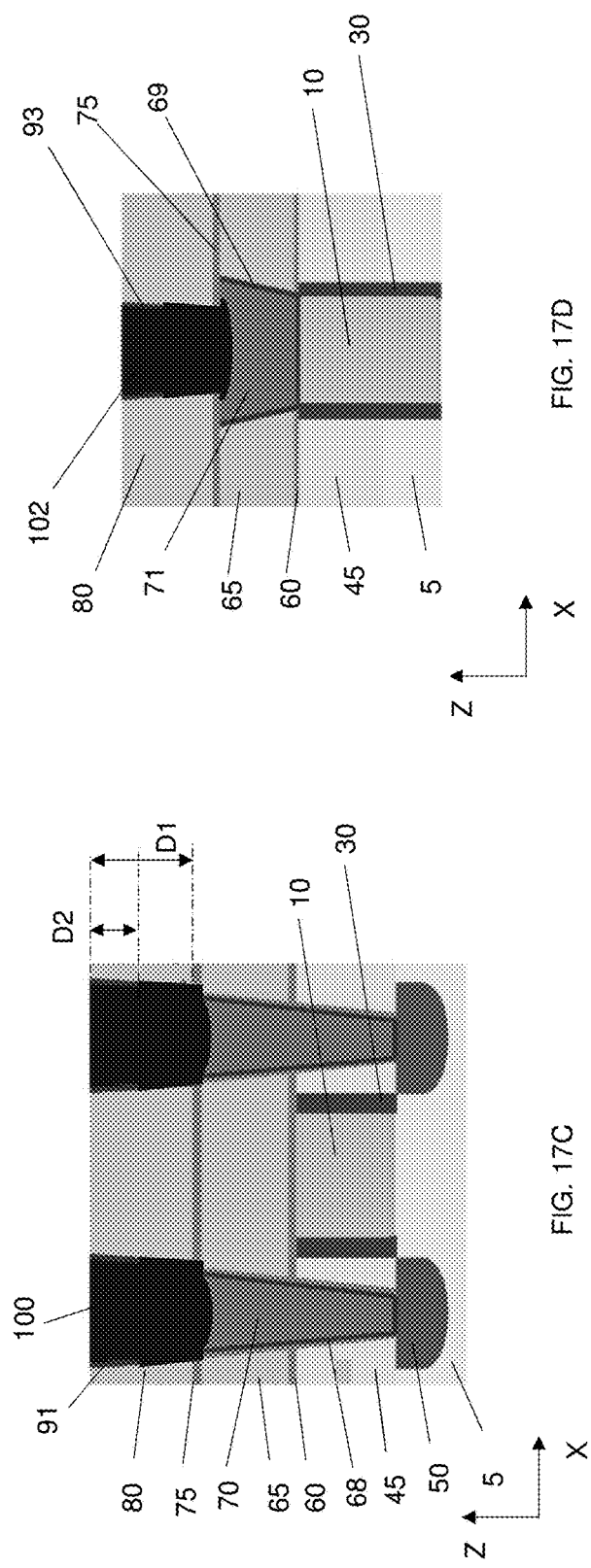

SEMICONDUCTOR DEVICE AND MANUFACTURING METHOD THEREOF

RELATED APPLICATION

This application claims priority to U.S. Provisional Patent Application No. 62/773,941 filed Nov. 30, 2018, the entire contents of which are incorporated herein by reference.

BACKGROUND

With a decrease of dimensions of semiconductor devices, a self-aligned contact (SAC) has been widely utilized for fabricating, e.g., source/drain contacts arranged closer to gate structures in a field effect transistor (FET). It is generally required that the source/drain contacts have lower resistivity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C and 1D show various views of a semiconductor device according to an embodiment of the present disclosure.

FIGS. 2A, 2B, 2C and 2D show various views of a semiconductor device according to an embodiment of the present disclosure.

FIGS. 4A, 4B, 4C and 4D show various views of a semiconductor device according to an embodiment of the present disclosure.

FIGS. 5A, 5B, 5C and 5D show various views of a semiconductor device according to an embodiment of the present disclosure.

FIGS. 6C and 6D are enlarged views of the gate structure. FIG. 6E shows a perspective view illustrating one of the various stages of a sequential fabrication process of a semiconductor device according to one embodiment of the present disclosure.

FIGS. 7A, 7B, 7C, 7D and 7E show cross sectional views of various stages of the sequential fabrication process of a semiconductor device according to an embodiment of the present disclosure.

FIGS. 12A, 12B, 12C and 12D show various views of a semiconductor device according to an embodiment of the present disclosure.

FIGS. 13A, 13B, 13C and 13D show various views of a semiconductor device according to an embodiment of the present disclosure.

FIGS. 16A, 16B, 16C and 16D show various views of a semiconductor device according to an embodiment of the present disclosure.

FIGS. 17A, 17B, 17C and 17D show various views of a semiconductor device according to an embodiment of the present disclosure.

DETAILED DESCRIPTION

Figure 3A:
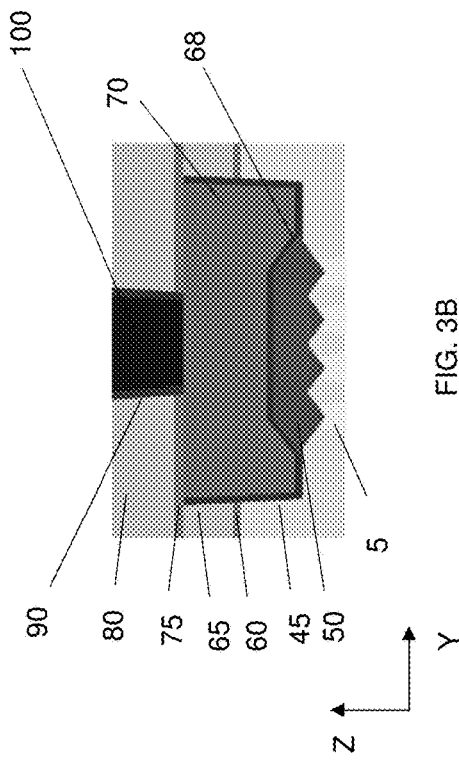
FIGS. 3A, 3B, 3C and 3D show various views of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations explained with respect to the one embodiment can be employed in other embodiments, and detailed explanation thereof may be omitted.

FIGS. 1A, 1B, 1C and 1D show various views of a semiconductor device according to an embodiment of the present disclosure. FIG. 1A is a plan view, FIG. 1B is a cross sectional view (Y-cut), FIG. 1C is a cross sectional view (X-cut 1) and FIG. 1D is a cross sectional view (X-cut 2). In some embodiments, the semiconductor device shown in FIGS. 1A-1D is a fin field effect transistor (Fin FET).

In FIG. 1A, three gate structures 10 extending in the Y direction are disposed over one fin structure 5 extending in the X direction. Portions between the gate structures 10 are source/drain regions 50, and source/drain contacts 70 are disposed over the source/drain regions 50. In some embodiments, the source/drain regions 50 include one or more epitaxially-formed semiconductor layers (epitaxial layers). In some embodiments, the source/drain contact 70 are contact bars extending in the Y direction beyond the source/drain regions 50. Thus, a width of the source/drain epitaxial layer (source/drain region) 50 is smaller than a width of the contact bar 70 in the Y direction. As shown in FIGS. 1A and 1B, a width of the source/drain contact 70 is greater than a width of the upper contact 100 in the Y direction, in some embodiments. In some embodiments, one or more gate contacts 71 are disposed over one or more gate electrodes of the gate structures 10. Further, in some embodiments, upper contacts 100 and 102 are disposed over the source/drain contacts 70 and the gate contact 71, respectively.

As shown in FIGS. 1B-1D, the source/drain regions 50 are formed in a recesses formed in the fin structure 5. The gate structure 10 includes a gate dielectric layer formed over the fin structure 5, a gate electrode and sidewall spacers 30. The gate structure 10 is embedded in a first interlayer dielectric (ILD) layer 45. The first ILD layer 45 includes one or more dielectric layers. In some embodiments, a first etch stop layer 60 is disposed over the first ILD layer 45, and a second ILD layer 65 is formed over the first etch stop layer 60. Further, a second etch stop layer 75 is disposed over the second ILD layer 65 and a third ILD layer 80 is formed over the second etch stop layer 75.

The first to third ILD layers 45, 65, 80 include one or more layers of insulating material, for example, a silicon oxide based material, such as silicon dioxide ($SiO_2$), SiOC and SiOCN. In some embodiments, a low-k material or an organic material is used for the ILD layers. The first and second etch stop layers 60, 75 are made of different material than the ILD layers and include one or more layers of insulating material, for example, silicon nitride based material, such as silicon nitride and SiON.

In some embodiments, the third ILD layer 80 includes silicon dioxide doped with Ge and/or Sn to introduce compressive stress in the third ILD layer 80. The compressive stress helps to firmly seal the upper contact 100 in the third ILD layer 80. Ge and/or Sn can be introduced into the third interlayer dielectric layer by ion implantation and/or in-situ doping. In some embodiments, a concentration of Ge and/or Sn is in a range from about 1 atomic % to 20 atomic %, and is in a range from about 5 atomic % to about 10 atomic % in other embodiments.

The source/drain contact 70 is formed in a contact hole passing through the first and second ILD layers 45, 65 and the first and second etch stop layers 60, 75. In some embodiments, a first contact liner layer 68 is formed on the inner surface of the contact hole. In some embodiments, the first contact liner layer 68 includes one or more conductive material layers, such as Ti, TiN, Ta and TaN. In certain embodiments, a TiN layer is used as the first contact line layer 68.

The source/drain contact 70 and the gate contact 71 include one or more conductive material layers, such as W, Co, Ni, Mo and an alloy thereof. In certain embodiments, the source/drain contact 70 and the gate contact 71 are made of Co.

The upper contact 100, 102 is formed in a contact hole passing through the third ILD layer 80 and the second etch stop layer 75. The upper contact 100, 102 includes one or more conductive material layers, such as W, Co, Ni, Mo, Cu, Al and an alloy thereof. In certain embodiments, the upper contacts 100, 102 are made of W In an embodiment shown in FIGS. 1A-1D, a second contact liner layer 90, 92 is formed only on the inner side surface of the contact hole formed in the third ILD layer 80. No contact liner layer is between the lower contacts (source/drain contact and gate contact) 70/71 and the upper contacts 100, 102. In other words, the upper contacts 100, 102 are in direct contact with the lower contacts 70, 71. In some embodiments, the second contact liner layers 90, 92 include one or more conductive material layers, such as Ti, TiN, Ta and TaN. In certain embodiments, the second contact liner layers 90, 92 are made of TiN. A thickness of the second contact liner layers 90, 92 are in a range from about 0.1 nm to about 0.5 nm in some embodiments. The second contact liner layers 90, 92 help to firmly seal the upper contacts 100, 102 in the third ILD layer 80. Since the upper contacts 100, 102 are in direct contact with the lower contact 70, 71, it is possible to decrease contact resistance between the lower contact and the upper contact.

The height (thickness) of the upper contacts 100, 102 are in a range from about 25 nm to about 50 nm in some embodiments.

FIGS. 2A, 2B, 2C and 2D show various views of a semiconductor device according to an embodiment of the present disclosure. FIG. 2A is a plan view, FIG. 2B is a cross sectional view (Y-cut), FIG. 2C is a cross sectional view (X-cut 1) and FIG. 2D is a cross sectional view (X-cut 2). Materials, configurations, dimensions, processes and/or operations explained with respect to the foregoing embodiments can be employed in the following embodiments, and detailed explanation thereof may be omitted. In some embodiments, the semiconductor device shown in FIGS. 2A-2D is a fin field effect transistor (Fin FET).

In an embodiment shown in FIGS. 2A-2D, the second contact liner layer 91 is formed partially on the inner side surface of the contact hole formed in the third ILD layer 80. In some embodiments, the second contact liner layer 91 is formed only on the upper portion so that the bottom of the second contact liner layer 91 is located at about 5% to less than about 100% of the contact hole from the top, and is located at about 10% to 90% of the contact hole from the top in other embodiments. In other words, the height D2 of the upper portion of the second contact liner layer 91 is about 5% to less than about 100% of a depth D1 of the contact hole in the third ILD layer 80 measured from a top of the opening, in some embodiments, and D2 is about 10% to about 90% of D1 in other embodiments. In certain embodiments, D2 is about 30% to about 70% of D1. In some embodiments, the depth D1 is in a range from about 5 nm to about 49.5 nm.

Similarly, the second contact liner layer 93 is formed partially on the inner side surface of the contact hole formed in the third ILD layer 80. In some embodiments, the second contact liner layer 93 is formed only on the upper portion so that the bottom of the second contact liner layer 93 is located at about 5% to less than about 100% of the contact hole from the top, and is located at about 10% to 90% of the contact hole from the top in other embodiments.

With this structure, it is possible to further decrease contact resistance between the lower contact and the upper contact.

Figure 3B:
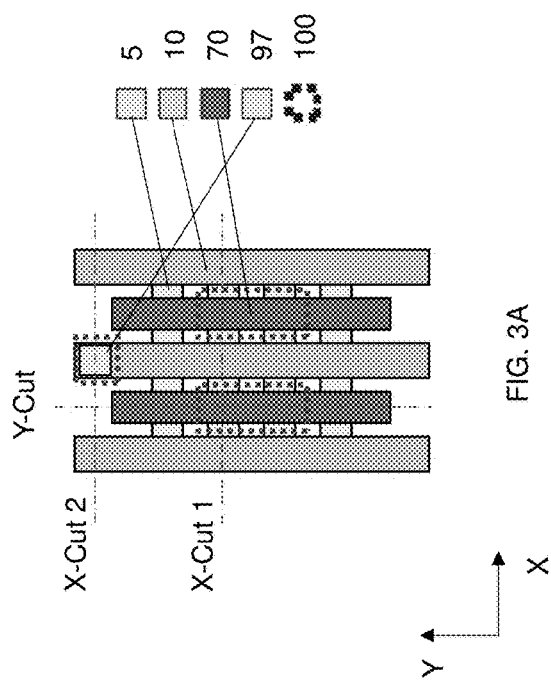
Figure 3D:
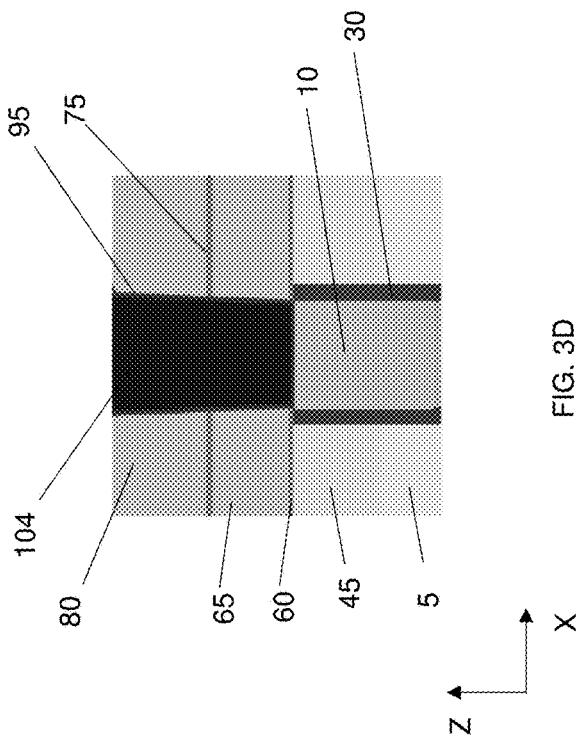
Figure 3C:
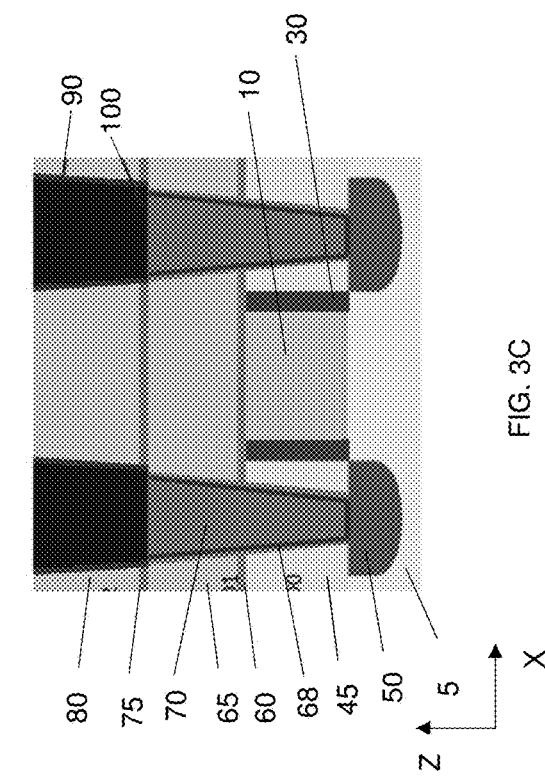

FIGS. 3A, 3B, 3C and 3D show various views of a semiconductor device according to an embodiment of the present disclosure. FIG. 3A is a plan view, FIG. 3B is a cross sectional view (Y-cut), FIG. 3C is a cross sectional view (X-cut 1) and FIG. 3D is a cross sectional view (X-cut 2). Materials, configurations, dimensions, processes and/or operations explained with respect to the foregoing embodiments can be employed in the following embodiments, and detailed explanation thereof may be omitted. In some embodiments, the semiconductor device shown in FIGS. 3A-3D is a fin field effect transistor (Fin FET).

The structure of the source/drain contact is the same as that shown in FIGS. 1A-1C. In this embodiment, as shown in FIG. 3D, a gate contact 104 is formed in a contact hole formed in the second and third ILD layers 65, 80. In some embodiments, the gate contact 104 includes one or more conductive material layers, such as W, Co, Ni, Mo, Cu, Al and an alloy thereof. In certain embodiments, the gate contact 104 is made of W.

In some embodiments, a third contact liner layer 95 formed in the contact hole. As shown in FIG. 3D, the third contact liner layer 95 is disposed between the gate contact 104 and the gate electrode of the gate structure 10, in some embodiments. With this structure, it is possible to enhance adhesiveness of W in the gate contact. In other embodiments, the third contact liner layer 95 is not disposed between the gate contact 104 and the gate electrode of the gate structure 10. In certain embodiments, the third contact liner layer 95 is a partial liner layer similar to the second contact liner layer 93 shown in FIG. 2D.

FIGS. 4A, 4B, 4C and 4D show various views of a semiconductor device according to an embodiment of the present disclosure. FIG. 4A is a plan view, FIG. 4B is a cross sectional view (Y-cut), FIG. 4C is a cross sectional view (X-cut 1) and FIG. 4D is a cross sectional view (X-cut 2). Materials, configurations, dimensions, processes and/or operations explained with respect to the foregoing embodiments can be employed in the following embodiments, and detailed explanation thereof may be omitted. In some embodiments, the semiconductor device shown in FIGS. 4A-4D is a fin field effect transistor (Fin FET).

The structure of the source/drain contact is the same as that shown in FIGS. 2A-2C, and the structure of the gate contact 104 is the same as that shown in FIG. 3D.

FIGS. 5A, 5B, 5C and 5D show various views of a semiconductor device according to an embodiment of the present disclosure. FIG. 5A is a plan view, FIG. 5B is a cross sectional view (Y-cut), FIG. 5C is a cross sectional view (X-cut 1) and FIG. 5D is a cross sectional view (X-cut 2). Materials, configurations, dimensions, processes and/or operations explained with respect to the foregoing embodiments can be employed in the following embodiments, and detailed explanation thereof may be omitted. In some embodiments, the semiconductor device shown in FIGS. 5A-5D is a fin field effect transistor (Fin FET).

The structure of the source/drain contact is the same as that shown in FIGS. 1A-1C. In some embodiments, the second contact liner layer 98 is disposed between the upper contact 106 and the gate contact 71, as shown in FIG. 5D. With this structure, it is possible to enhance adhesiveness of W in the upper contact 106. In some embodiments, the structure of the source/drain contact is the same as that shown in FIGS. 2A-2C.

Figure 6A:
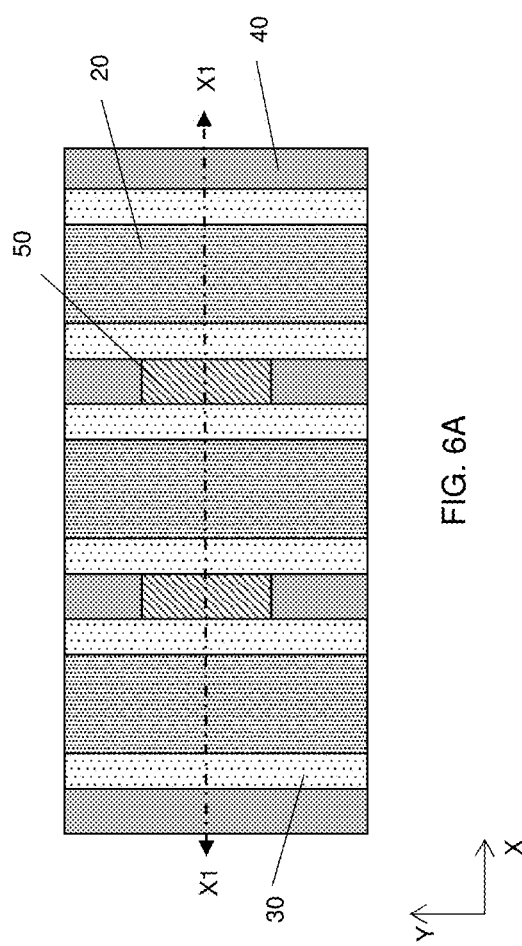
FIG. 6A shows a plan view (viewed from the above) illustrating one of the various stages of a sequential fabrication process of a semiconductor device according to one embodiment of the present disclosure.
Figure 6B:
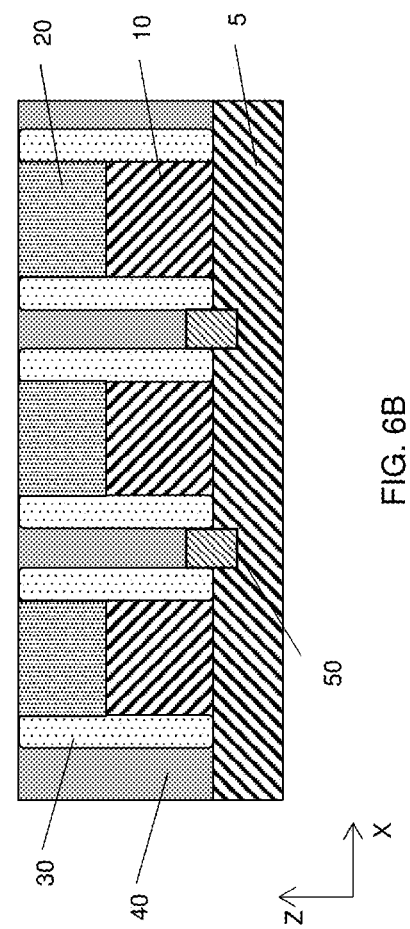
FIG. 6B shows a cross sectional view along line X1-X1 of FIG. 6A.

FIGS. 6A and 6B show one of the stages of a sequential fabrication process of a semiconductor device according to one embodiment of the present disclosure. FIG. 6A shows a plan (top) view and FIG. 6B shows a cross sectional view along line X1-X1 of FIG. 6A.

FIGS. 6A and 6B show a structure of a semiconductor device after metal gate structures 10 are formed. In FIGS. 6A and 6B, metal gate structures 10 are formed over a channel region of the fin structure 5, for example, a part of a fin structure, and cap insulating layers 20 are disposed over the metal gate structures 10. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 8 nm in other embodiments. The combination of the metal gate structure 10, the cap insulating layer 20 and sidewall spacers 30 may be collectively referred to as a gate structure. Further, source/drain regions 50 are formed adjacent to the gate structures, and spaces between the gate structures are filled with an interlayer dielectric (ILD) layer 40.

FIG. 6C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, other conductive materials. A gate dielectric layer 12 disposed between the channel region of the fin structure 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 (MG) are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The sidewall spacer 30 is made of a different material than the cap insulating layer 20 and includes one or more layers of insulating material such as silicon nitride based material including SiN, SiON, SiCN and SiOCN. The ILD layer 40 includes one or more layers of insulating material such as silicon oxide based material such as silicon dioxide (SiO$_2$) and SiON.

In some embodiments, no gate cap insulating layer is formed, as shown in FIG. 6D.

The material of the sidewall spacer 30, the material of the cap insulating layer 20, and a material of the ILD layer 40 are different from each other, so that each of these layers can be selectively etched. In one embodiment, the sidewall spacer 30 is made of SiOCN, SiCN or SiON, the cap insulating layer 20 is made of SiN, and the ILD 40 layer is made of SiO$_2$.

In this embodiment, fin field effect transistors (Fin FETs) fabricated by a gate-replacement process are employed.

FIG. 6E shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about 1×10$^{15}$ cm$^{-3}$ to about 1×10$^{18}$ cm$^{-3}$. In other embodiments, the substrate is an n-type silicon substrate with an impurity concentration in a range from about 1×10$^{15}$ cm$^{-3}$ to about 1×10$^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 6E. In FIG. 6E, parts of the metal gate structure 330, the cap isolation layer 340, sidewalls 350 and the ILD 370 are cut to show the underlying structure.

The metal gate structure 330, the cap isolation layer 340, sidewalls 350, source/drain 360 and the ILD 370 of FIG. 6E substantially correspond to the metal gate structures 10, cap insulating layers 20, sidewall spacers 30, source/drain regions 50 and interlayer dielectric layer (ILD) 40, of FIGS. 6A-6D, respectively. In some embodiments, one or more ILD layer is additionally formed over the ILD layer 40, thereby forming a first ILD layer 45.

FIGS. 7A-7E and 8A-8D show the stages of a sequential fabrication process of a semiconductor device corresponding to the structure shown in FIGS. 1A-1C according to one embodiment of the present disclosure. In FIGS. 7A-8D, four fin structures 5 are shown, but the number of the fin structures 5 is not limited to four, and can be one, two, three or five or more.

After the metal gate structure is formed, the first etch stop layer 60 is formed over the first ILD layer 45 (or 40), and the second ILD layer 65 is formed over the first etch stop layer 60, as shown in FIG. 7A. The etch stop layer and the ILD layer are formed by suitable film formation methods, such as CVD, physical vapor deposition (PVD) or atomic layer deposition (ALD).

By using one or more lithography and etching operations, a contact hole (opening) 67 for the lower contact 70 is formed in the first and second ILD layers 45, 65, as shown in FIG. 7B.

Then, the first contact liner layer 68 is conformally formed in the contact hole 67 and on the upper surface of the second ILD layer 65, and a conductive material is formed over the first contact liner layer 68. The contact liner layer 68 and the conductive material layer are formed by suitable film formation methods, such as CVD, PVD, ALD or plating. Subsequently, a planarization operation, such as an etch back operation or a chemical mechanical polishing (CMP) operation, is performed to form the source/drain contact 70, as shown in FIG. 7C.

Subsequently, a second etch stop layer 75 and the third ILD layer 80 are formed, as shown in FIG. 7D. In some embodiments, the third ILD layer 80 is doped with Ge and/or Sn formed by in-situ doping in a deposition process. In other embodiments, after the third ILD layer 80 is formed, an ion implantation operation is performed to introduce Ge and/or Sn into the third ILD layer 80. In other embodiments, the implantation operation is performed at a later stage of the manufacturing operation.

As shown in FIG. 7E, by using one or more lithography and etching operations, a contact hole (opening) 82 for the upper contact is formed in the third ILD layer 80 and the second etch stop layer 75.

Figure 8A:
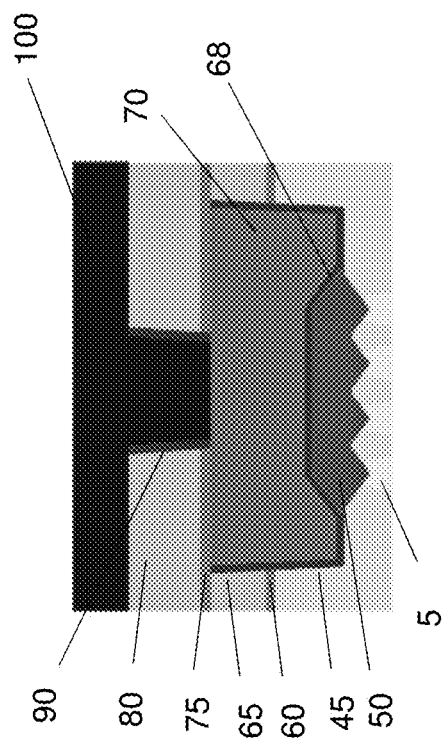
FIGS. 8A, 8B, 8C and 8D show cross sectional views of various stages of the sequential fabrication process of a semiconductor device according to an embodiment of the present disclosure.

Then, as shown in FIG. 8A, a second contact liner layer 90 is conformally formed in the contact hole 82. The second contact liner layer 90 is formed by suitable film formation methods, such as CVD, PVD, ALD or plating.

Figure 8C:
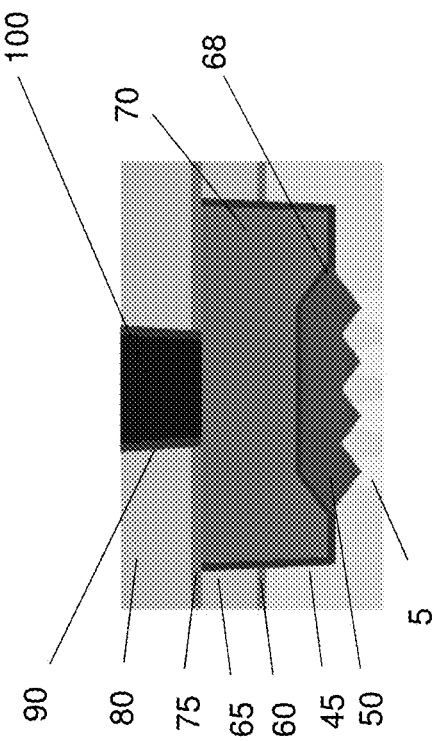
Figure 8B:
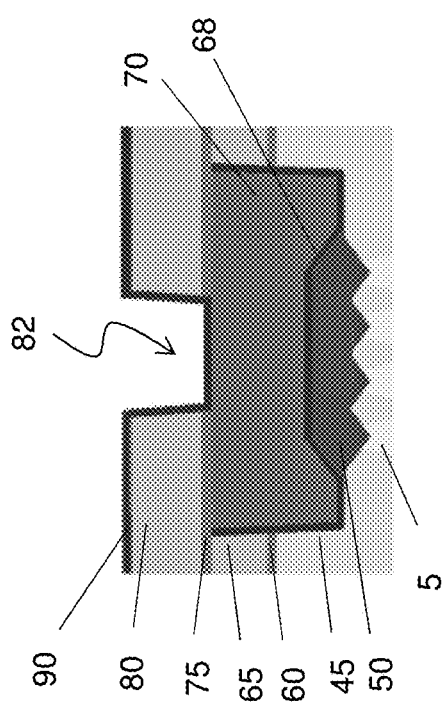

As shown in FIG. 8B, an etch-back operation or other anisotropic etching operation is performed to remove the second contact liner layer 90 formed on horizontal surfaces of the third ILD layer 80 and the bottom of the contact hole 82. Thus, a part of the lower contact (source/drain contact) 70 is exposed in the contact hole 82.

Then, as shown in FIG. 8C, one or more conductive material layers are formed in the contact hole 82 and the third ILD layer 80. The conductive layer is formed by suitable film formation methods, such as CVD, PVD, ALD or plating. In some embodiments, the conductive material is formed at a temperature in a range from about 200° C. to about 400° C.

Figure 8D:
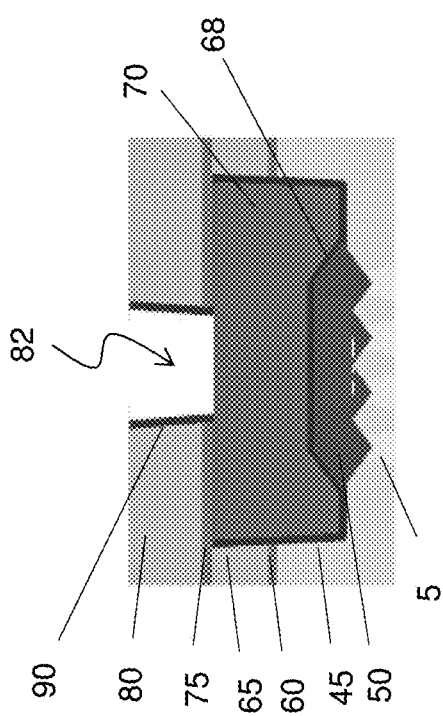

Then, a planarization operation, such as an etch back operation or a CMP operation, is performed to form the upper contact 100, as shown in FIG. 8D. In some embodiments, after the upper contact 100 is formed, an ion implantation operation is performed to introduce Ge and/or Sn into the third ILD layer 80. In such a case, the upper contact 100 contains Ge and/or Sn.

FIGS. 8E, 8F, 8G and 8H show cross sectional views of various stages of the sequential fabrication process of a semiconductor device according to another embodiment of the present disclosure.

Figure 8F:
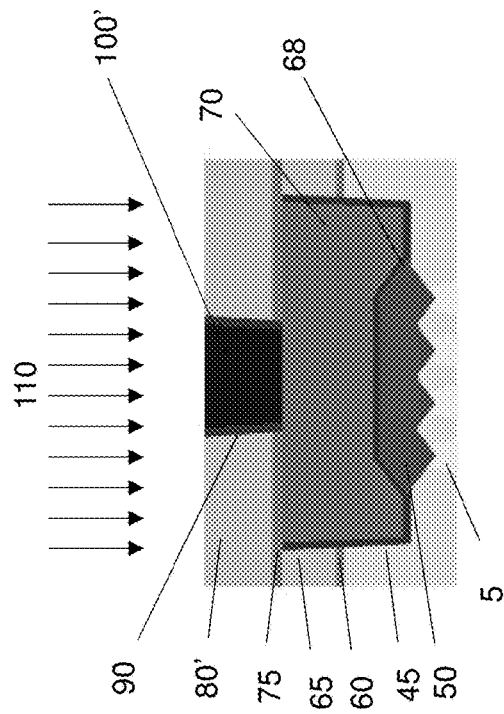
FIGS. 8E, 8F, 8G and 8H show cross sectional views of various stages of the sequential fabrication process of a semiconductor device according to an embodiment of the present disclosure.
Figure 8H:
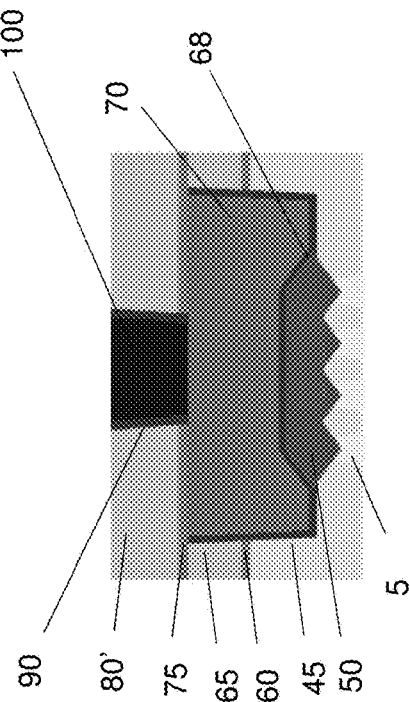
Figure 8E:
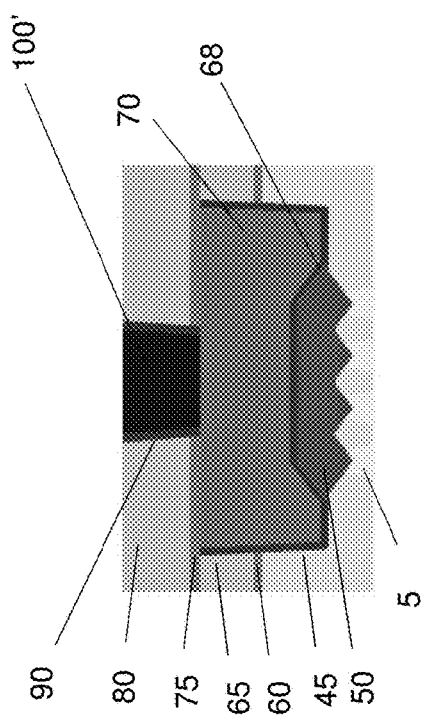

In some embodiments, after the contact hole 82 is formed as shown in FIG. 8B, an initial contact 100' is formed in the contact hole 82 by a selective deposition operation, such as a selective CVD and a selective ALD, as shown in FIG. 8E. In some embodiments, the initial contact 100' is made of tungsten. After the initial contact 100' is formed, an ion implantation operation 110 is performed to introduce Ge and/or An into the third ILD layer 80 to form a Ge/Sn containing third ILD layer 80', as shown in FIG. 8F. In some embodiments, some ions are also introduced in the initial contact 100'.

Figure 8G:
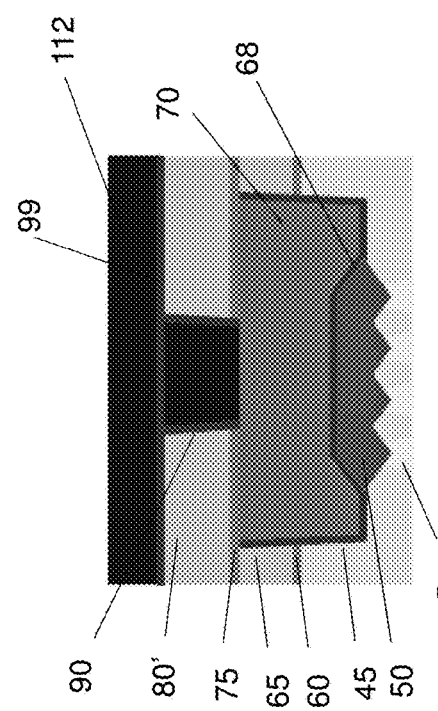

Subsequently, as shown in FIG. 8G, a third contact liner layer 99 is formed over the Ge/Sn containing third ILD layer 80' and the initial contact 100' and a metal layer 112 is formed over the third contact liner layer 99. In some embodiments, the third contact liner layer 99 is made of TiN, Ti, Ta and/or TaN, and the metal layer 112 is made of W, Co, Ni, Mo, Cu and/or Al. In some embodiments, the metal layer 112 is made of W. After a chemical mechanical polishing operation, the structure shown in FIG. 8H is obtained.

FIGS. 9A-9E show the stages of a sequential fabrication process of a semiconductor device corresponding to the structure shown in FIGS. 2A-2C according to one embodiment of the present disclosure.

Figure 9A:
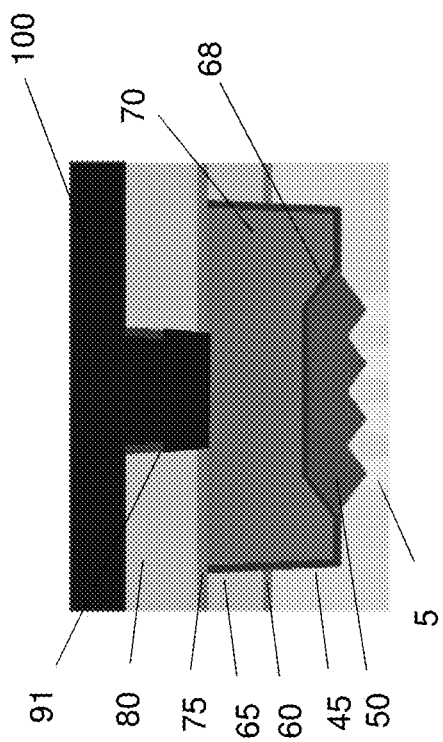
FIGS. 9A, 9B, 9C, 9D and 9E show cross sectional views of various stages of the sequential fabrication process of a semiconductor device according to an embodiment of the present disclosure.

After the contact hole 82 is formed as shown in FIG. 7E, a second contact liner layer 91 is formed in the contact hole 82 and on the third ILD layer 80, as shown in FIG. 9A. In some embodiments, the second contact liner layer 91 is formed in a non-conformal manner such that the thickness of the second contact liner layer 91 on the inner sidewall of the contact hole 82 decreases from the top of the contact hole 82. In some embodiments, the second contact liner layer 91 has an overhang shape at the corner of the top of the contact hole 82.

Figure 9C:
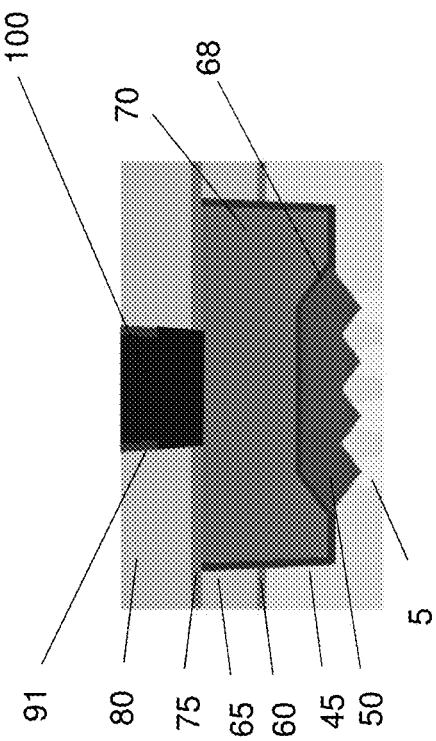
Figure 9B:
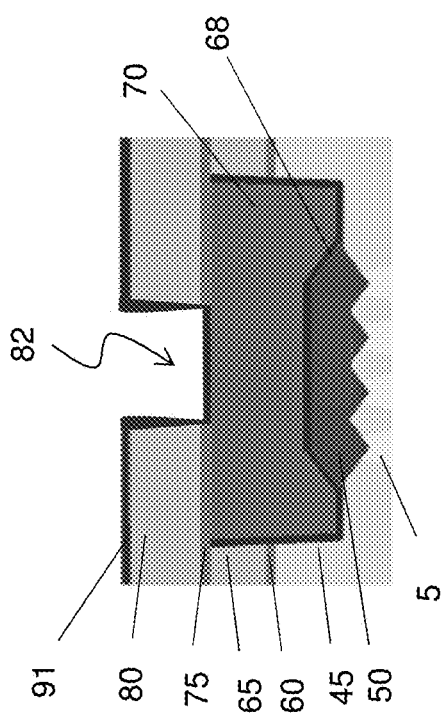

Then, as shown in FIG. 9B, an etch-back operation or other anisotropic etching operation is performed to remove the second contact liner layer 91 formed on horizontal surfaces of the third ILD layer 80 and the bottom of the contact hole 82. Thus, a part of the lower contact (source/drain contact) 70 is exposed in the contact hole 82. As shown in FIG. 9B, the second contact liner layer 91 remains only on an upper portion of the contact hole 82 and the third ILD layer 80 and the second etch stop layer 75 are exposed in the contact hole 82.

Figure 9D:
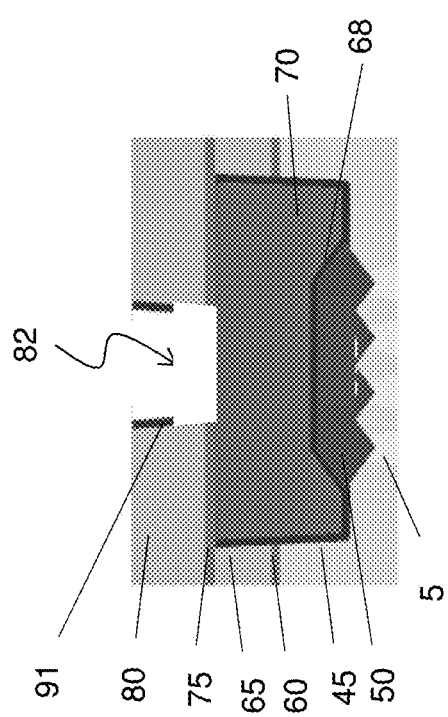

Then, as shown in FIG. 9C, one or more conductive material layers are formed in the contact hole 82 and the third ILD layer 80. Then, a planarization operation, such as an etch back operation or a CMP operation, is performed to form the upper contact 100, as shown in FIG. 9D. As shown in FIG. 9D, the upper contact 100 is in contact with the third ILD layer 80 and the second etch stop layer 75 at a lower portion of the contact hole.

Figure 9E:
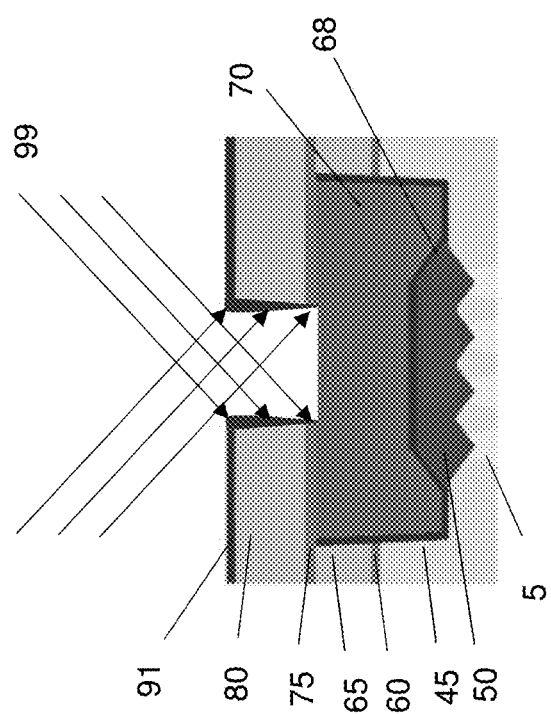

In some embodiments, as shown in FIG. 9E, when forming the second contact liner layer 91, the substrate is tilted with respect to sputtered material flux 99, and the second contact line layer 91 has a thickness decreasing from the top of the contact hole 82. In some embodiments, substantially no liner layer is formed at the bottom of the contact hole 82. Subsequently, with or without anisotropic etching on the second contact liner layer 91, the conductive layer for the upper contact 100 is formed.

In some embodiments, operations similar to FIGS. 8E, 8F, 8G and 8H are performed after the structure shown in FIG. 9B is formed.

It is understood that the device shown in FIGS. 8D, 8H and 9D undergoes further CMOS processes to form various features such as interconnect metal layers, dielectric layers, passivation layers, etc.

FIGS. 10A-10E show the stages of a sequential fabrication process of a semiconductor device corresponding to the structure shown in FIG. 1D according to one embodiment of the present disclosure.

Figure 10C:
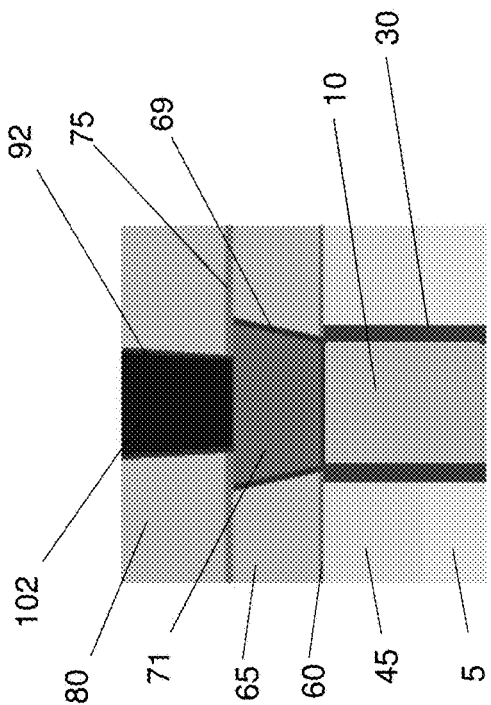
FIGS. 10A, 10B, 10C and 10D show cross sectional views of various stages of the sequential fabrication process of a semiconductor device according to an embodiment of the present disclosure.
Figure 10D:
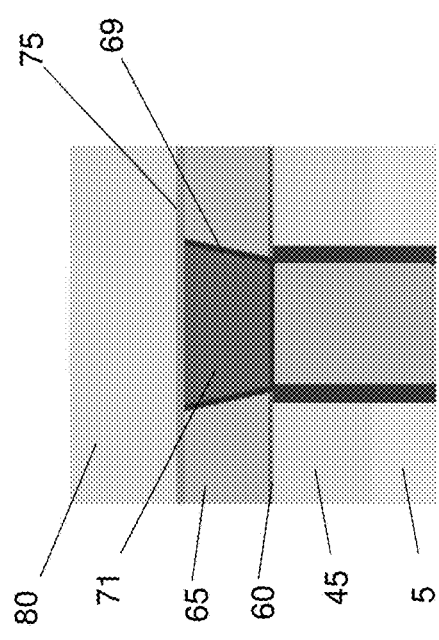
Figure 10A:
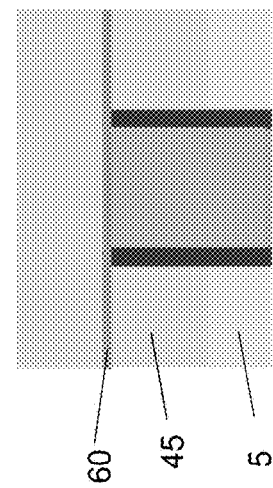

After the metal gate structure is formed, the first etch stop layer 60 is formed over the first ILD layer 45 (or 40), and the second ILD layer 65 is formed over the first etch stop layer 60, as shown in FIG. 10A. The etch stop layer and the ILD layer are formed by suitable film formation methods, such as CVD, physical vapor deposition (PVD) or atomic layer deposition (ALD). These operations are the same as those shown in FIG. 7A (performed at the same time).

Figure 10B:
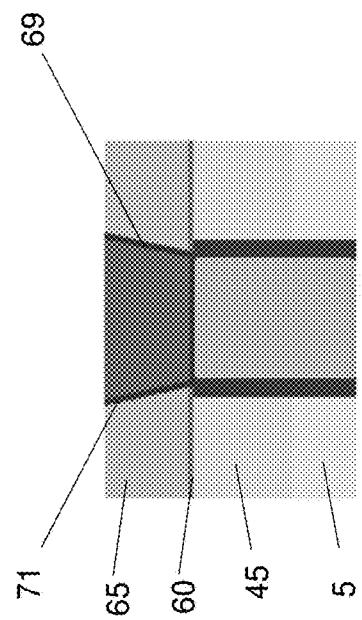

By using one or more lithography and etching operations, a contact hole (opening) for the lower contact 71 is formed in the first and second ILD layers 45, 65, the first contact liner layer 69 is conformally formed in the contact hole and on the upper surface of the second ILD layer 65, and then a conductive material is formed over the first contact liner layer 69. Subsequently, a planarization operation, such as an etch back operation or a chemical mechanical polishing (CMP) operation, is performed to form the gate contact 71, as shown in FIG. 10B. In some embodiments, these operations are the same as those shown in FIGS. 7B and 7C (performed at the same time). In other embodiments, these operations are separately performed from those shown in FIGS. 7B and 7C.

Subsequently, a second etch stop layer 75 and the third ILD layer 80 are formed, as shown in FIG. 10C. These operations are the same as those shown in FIG. 7D (performed at the same time).

As shown in FIG. 10D, by using one or more lithography and etching operations, a contact hole (opening) for the upper contact is formed in the third ILD layer 80 and the second etch stop layer 75. Then, a second contact liner layer 92 is conformally formed in the contact hole. An etch-back operation or other anisotropic etching operation is performed to remove the second contact liner layer 92 formed on horizontal surfaces of the third ILD layer 80 and the bottom of the contact hole. Thus, a part of the lower contact (gate contact) 71 is exposed in the contact hole. Then, one or more conductive material layers are formed in the contact hole and the third ILD layer 80. Then, a planarization operation, such as an etch back operation or a CMP operation, is performed to form the upper contact 102, as shown in FIG. 10D. These operations are the same as those shown in FIGS. 8A-8D (performed at the same time) in some embodiments. In other embodiments, these operations are separately performed from those shown in FIGS. 8A-8D. In some embodiments, no etch back or anisotropic etching is performed on the second contact liner layer 92 so as not to remove the second contact liner layer 92 from the bottom of the contact hole to form the structure shown in FIG. 5D.

FIGS. 11A-11D show the stages of a sequential fabrication process of a semiconductor device corresponding to the structure shown in FIGS. 3D and 4D according to one embodiment of the present disclosure.

Figure 11C:
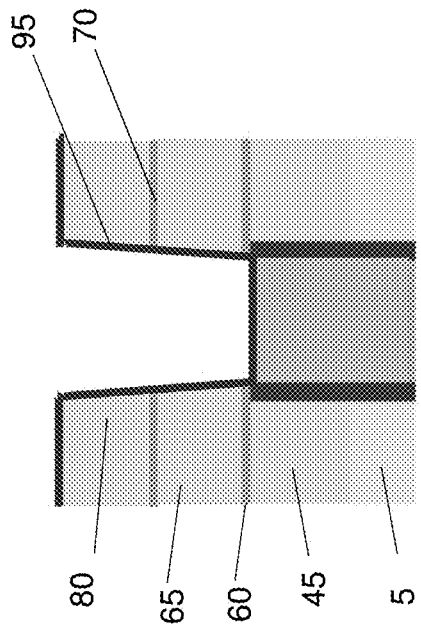
FIGS. 11A, 11B, 11C and 11D show cross sectional views of various stages of the sequential fabrication process of a semiconductor device according to an embodiment of the present disclosure.
Figure 11D:
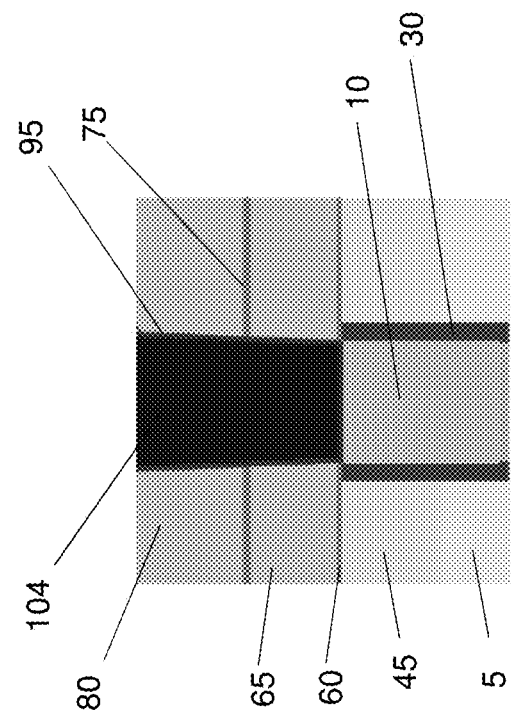
Figure 11A:
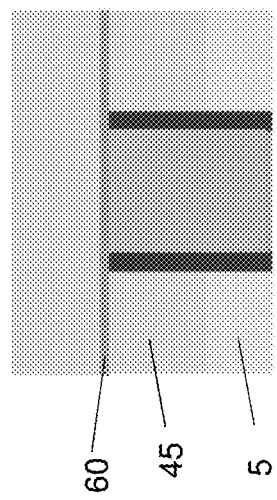
Figure 11B:
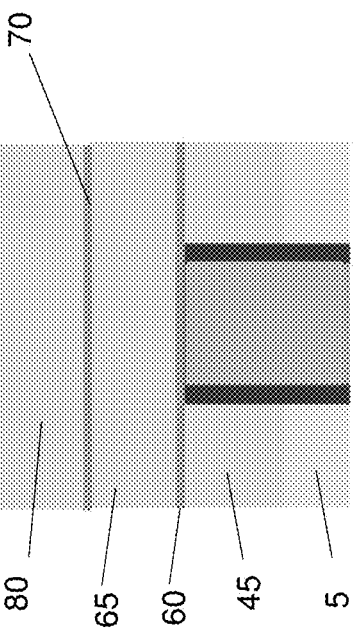

After the metal gate structure is formed, the first etch stop layer 60 is formed over the first ILD layer 45 (or 40), and the second ILD layer 65 is formed over the first etch stop layer 60, as shown in FIG. 11A. The etch stop layer and the ILD layer are formed by suitable film formation methods, such as CVD, physical vapor deposition (PVD) or atomic layer deposition (ALD). Further, a second etch stop layer 75 and the third ILD layer 80 are formed, as shown in FIG. 11B. These operations are the same as those shown in FIGS. 7A and 7D (performed at the same time).

As shown in FIG. 11C, by using one or more lithography and etching operations, a contact hole (opening) for the gate contact is formed in the second and third ILD layers 65, 80 and the first and second etch stop layers 60, 75. Then, a third contact liner layer 95 is conformally formed in the contact hole. Then, one or more conductive material layers are formed in the contact hole and the third ILD layer 80. Then, a planarization operation, such as an etch back operation or a CMP operation, is performed to form the upper contact 104, as shown in FIG. 11D. These operations are separately performed from those shown in FIGS. 8A-8D.

In some embodiments, an etch-back operation or other anisotropic etching operation is performed to remove the third contact liner layer 95 formed on horizontal surfaces of the third ILD layer 80 and the bottom of the contact hole. In such a case, a part of the gate electrode is exposed in the contact hole.

FIGS. 12A, 12B, 12C and 12D show various views of a semiconductor device according to an embodiment of the present disclosure. FIG. 12A is a plan view, FIG. 12B is a cross sectional view (Y-cut), FIG. 12C is a cross sectional view (X-cut 1) and FIG. 12D is a cross sectional view (X-cut 2). Materials, configurations, dimensions, processes and/or operations explained with respect to the foregoing embodiments can be employed in the following embodiments, and detailed explanation thereof may be omitted.

In an embodiment shown in FIGS. 12A-12D, the upper contact 100 partially penetrates into the lower contacts 70, 71. The depth D11 of the recess measured from the upper surface of the lower contact 70 (or the lower surface of the second etch stop layer 75) in the vertical direction is in a range from about 0.1 nm to about 20 nm in some embodiments. In other embodiments, the depth D11 is in a range from about 1 nm to about 10 nm. As shown in FIG. 12C, the recess is formed only at the upper surface of the source/drain contact 70 and/or only at the upper surface the gate contact.

FIGS. 13A, 13B, 13C and 13D show various views of a semiconductor device according to an embodiment of the present disclosure. FIG. 13A is a plan view, FIG. 13B is a cross sectional view (Y-cut), FIG. 13C is a cross sectional view (X-cut 1) and FIG. 13D is a cross sectional view (X-cut 2). Materials, configurations, dimensions, processes and/or operations explained with respect to the foregoing embodiments can be employed in the following embodiments, and detailed explanation thereof may be omitted.

In an embodiment shown in FIGS. 13A-13D, similar to the embodiments explained with respect to FIGS. 2A-2D, the second contact liner layer 91 is formed partially on the inner side surface of the contact hole formed in the third ILD layer 80 (e.g., only on the upper portion). As shown in FIGS. 13A-13D, the upper contact 100 partially penetrates into the lower contacts 70, 71. The depth D11 of the recess measured from the upper surface of the lower contact 70 (or the lower surface of the second etch stop layer 75) in the vertical direction is in a range from about 0.1 nm to about 20 nm in some embodiments. In other embodiments, the depth D11 is in a range from about 1 nm to about 10 nm.

Figure 14A:
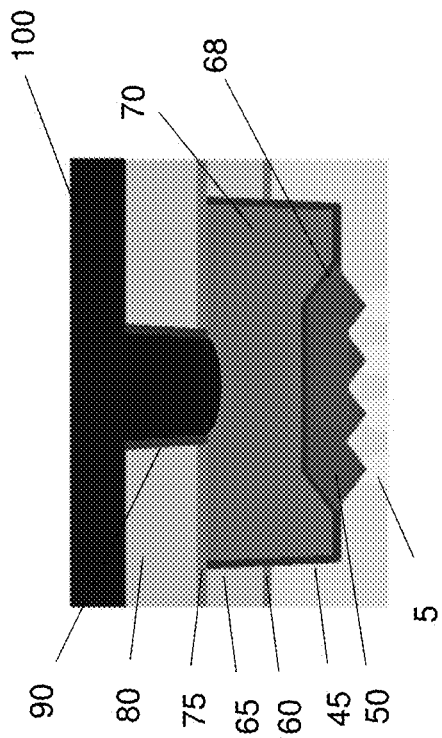
FIGS. 14A, 14B and 14C show cross sectional views of various stages of the sequential fabrication process of a semiconductor device according to an embodiment of the present disclosure.
Figure 14B:
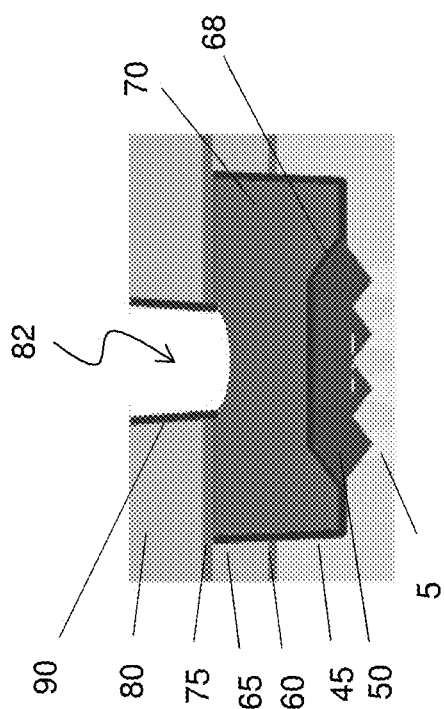

FIGS. 14A and 14B show cross sectional views of various stages of the sequential fabrication process of the semiconductor device shown in FIGS. 12A-12D according to an embodiment of the present disclosure.

Figure 14C:
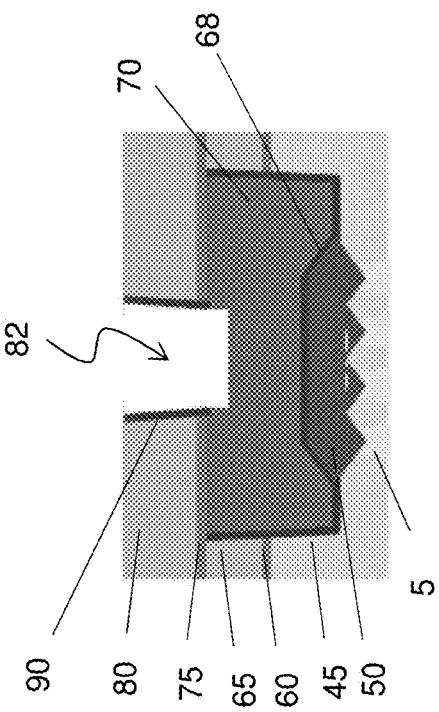

After the second contact liner layer 90 formed on horizontal surfaces of the third ILD layer 80 and the bottom of the contact hole 82 is removed as shown in FIG. 8B, the exposed upper portion of the source/drain contacts 70 is etched to form a recess. The etching is one or more of plasma dry etching operation and/or wet etching operations in some embodiments. In some embodiments, the recess has an arc shape as shown in FIG. 14A. In other embodiments, the recess has a rectangular or a trapezoidal shape as shown in FIG. 14C. In some embodiments, anisotropic etching is performed to form the recess. After the recess is formed, similar to the operations explained with respect to FIG. 8C, one or more conductive material layers are formed in the recessed contact hole 82 and the third ILD layer 80, as shown in FIG. 14B. Subsequently, the operations similar to the operations explained with respect to FIG. 8D are performed. In other embodiments, after the recess is formed, operations similar to the operations explained with respect to FIGS. 8E-8H are performed.

Figure 15A:
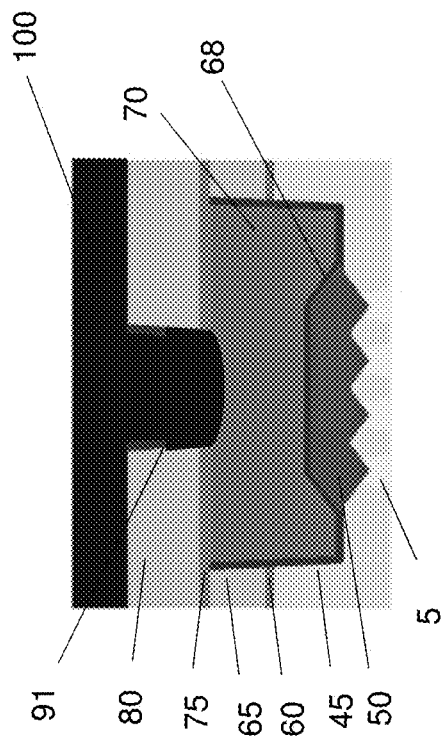
FIGS. 15A, 15B and 15C show cross sectional views of various stages of the sequential fabrication process of a semiconductor device according to an embodiment of the present disclosure.
Figure 15B:
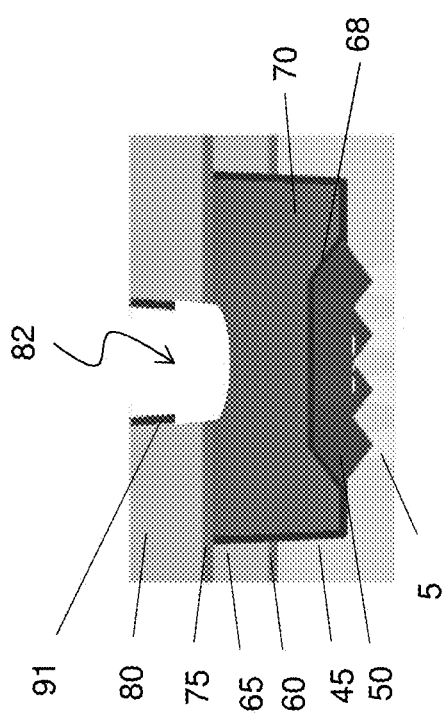

FIGS. 15A and 15B show cross sectional views of various stages of the sequential fabrication process of the semiconductor device shown in FIGS. 13A-13D according to an embodiment of the present disclosure.

Figure 15C:
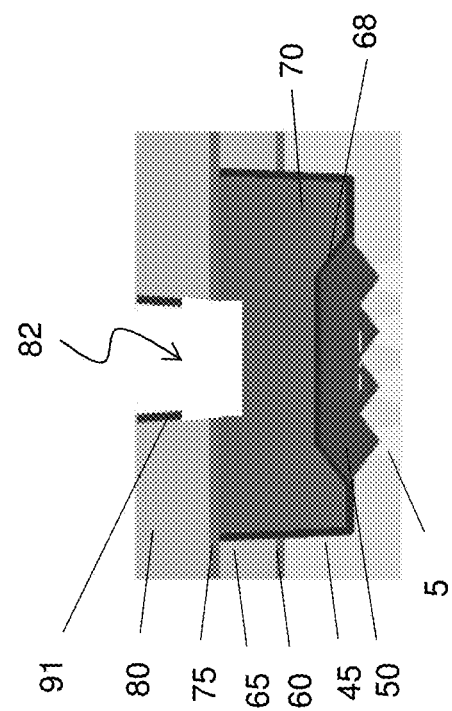

After the second contact liner layer 90 formed on horizontal surfaces of the third ILD layer 80 and the bottom of the contact hole 82 is removed as shown in FIG. 9B, the exposed upper portion of the source/drain contacts 70 is etched to form a recess. The etching is one or more of plasma dry etching operation and/or wet etching operations in some embodiments. In some embodiments, the recess has an arc shape as shown in FIG. 15A. In other embodiments, the recess has a rectangular or a trapezoidal shape as shown in FIG. 15C. In some embodiments, anisotropic etching is performed to form the recess. After the recess is formed, similar to the operations explained with respect to FIG. 9C, one or more conductive material layers are formed in the recessed contact hole 82 and the third ILD layer 80, as shown in FIG. 15B. Subsequently, the operations similar to the operations explained with respect to FIG. 9D are performed. In other embodiments, after the recess is formed, operations similar to the operations explained with respect to FIGS. 8E-8H are performed.

FIGS. 16A, 16B, 16C and 16D show various views of a semiconductor device according to an embodiment of the present disclosure. FIG. 16A is a plan view, FIG. 16B is a cross sectional view (Y-cut), FIG. 16C is a cross sectional view (X-cut 1) and FIG. 16D is a cross sectional view (X-cut 2). Materials, configurations, dimensions, processes and/or operations explained with respect to the foregoing embodiments can be employed in the following embodiments, and detailed explanation thereof may be omitted.

In an embodiment shown in FIGS. 16A-16D, the upper contact 100 partially penetrates into the lower contacts 70, 71 not only vertically but also horizontally. The depth D11 of the recess measured from the upper surface of the lower contact 70 (or the lower surface of the second etch stop layer 75) in the vertical direction is in a range from about 0.1 nm to about 20 nm in some embodiments. In other embodiments, the depth D11 is in a range from about 1 nm to about 10 nm. In some embodiments, the recessed width H1 measured from a point corresponding to the narrowest width of the upper contact 100 (e.g., at the bottom of the second etch stop layer 75) in the horizontal direction is in a range from about 0.1 nm to about 20 nm in some embodiments. In other embodiments, the width H1 is in a range from about 1 nm to about 10 nm.

FIGS. 17A, 17B, 17C and 17D show various views of a semiconductor device according to an embodiment of the present disclosure. FIG. 17A is a plan view, FIG. 17B is a cross sectional view (Y-cut), FIG. 17C is a cross sectional view (X-cut 1) and FIG. 17D is a cross sectional view (X-cut 2). Materials, configurations, dimensions, processes and/or operations explained with respect to the foregoing embodiments can be employed in the following embodiments, and detailed explanation thereof may be omitted.

In an embodiment shown in FIGS. 17A-17D, similar to the embodiments explained with respect to FIGS. 2A-2D, the second contact liner layer 91 is formed partially on the inner side surface of the contact hole formed in the third ILD layer 80 (e.g., only on the upper portion). As shown in FIGS. 17A-17D, the upper contact 100 partially penetrates into the lower contacts 70, 71 not only vertically but also horizontally. The depth D11 of the recess measured from the upper surface of the lower contact 70 (or the lower surface of the second etch stop layer 75) in the vertical direction is in a range from about 0.1 nm to about 20 nm in some embodiments. In other embodiments, the depth D11 is in a range from about 1 nm to about 10 nm. In some embodiments, the recessed width H1 measured from a point corresponding to the narrowest width of the upper contact 100 (e.g., at the bottom of the second etch stop layer 75) in the horizontal direction is in a range from about 0.1 nm to about 20 nm in some embodiments. In other embodiments, the width H1 is in a range from about 1 nm to about 10 nm.

Figure 18A:
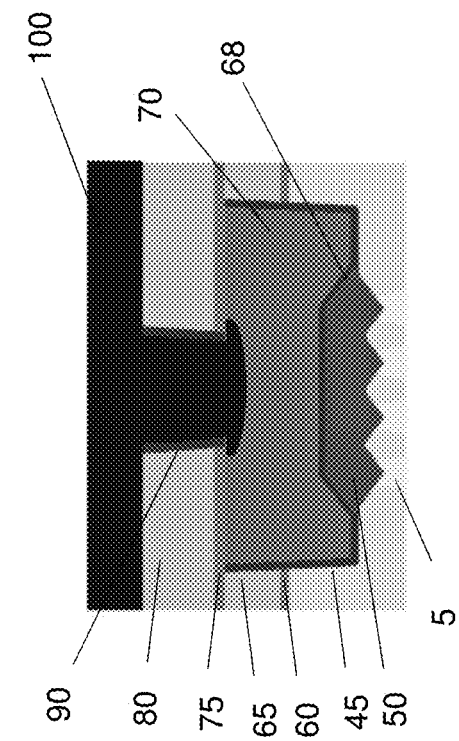
FIGS. 18A, 18B and 18C show cross sectional views of various stages of the sequential fabrication process of a semiconductor device according to an embodiment of the present disclosure.
Figure 18B:
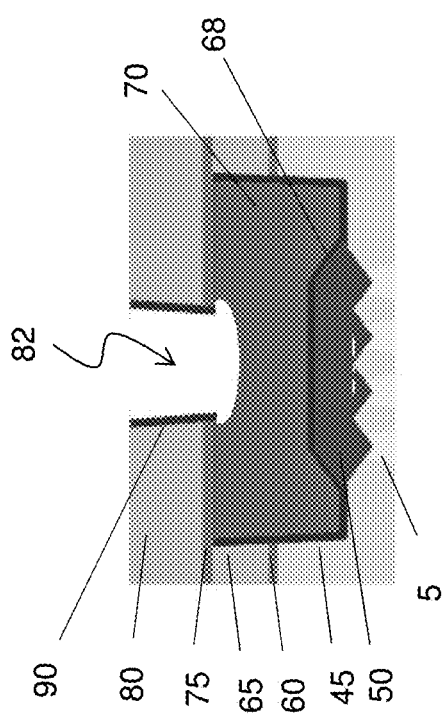

FIGS. 18A and 18B show cross sectional views of various stages of the sequential fabrication process of the semiconductor device shown in FIGS. 16A-16D according to an embodiment of the present disclosure.

Figure 18C:
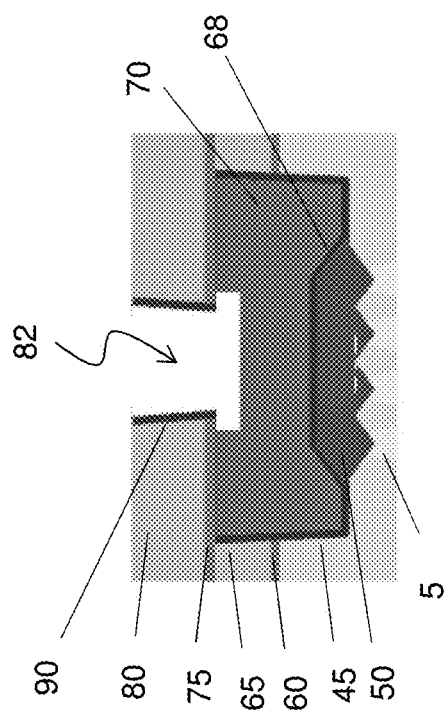

After the second contact liner layer 90 formed on horizontal surfaces of the third ILD layer 80 and the bottom of the contact hole 82 is removed as shown in FIG. 8B, the exposed upper portion of the source/drain contacts 70 is vertically and laterally (horizontally) etched to form a recess. The etching is one or more of plasma dry etching operation and/or wet etching operations in some embodiments. In some embodiments, the bottom of recess has an arc shape as shown in FIG. 18A. In other embodiments, the recess has a rectangular or a trapezoidal shape, as shown in FIG. 18C. In some embodiments, isotropic etching, such as wet etching, is performed to form the recess. After the recess is formed, similar to the operations explained with respect to FIG. 8C, one or more conductive material layers are formed in the recessed contact hole 82 and the third ILD layer 80, as shown in FIG. 18B. Subsequently, the operations similar to the operations explained with respect to FIG. 8D are performed. In other embodiments, after the recess is formed, operations similar to the operations explained with respect to FIGS. 8E-8H are performed.

Figure 19A:
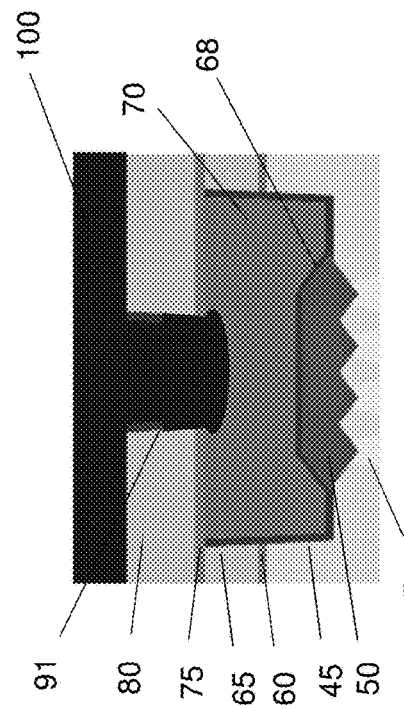
FIGS. 19A, 19B and 19C show cross sectional views of various stages of the sequential fabrication process of a semiconductor device according to an embodiment of the present disclosure.
Figure 19B:
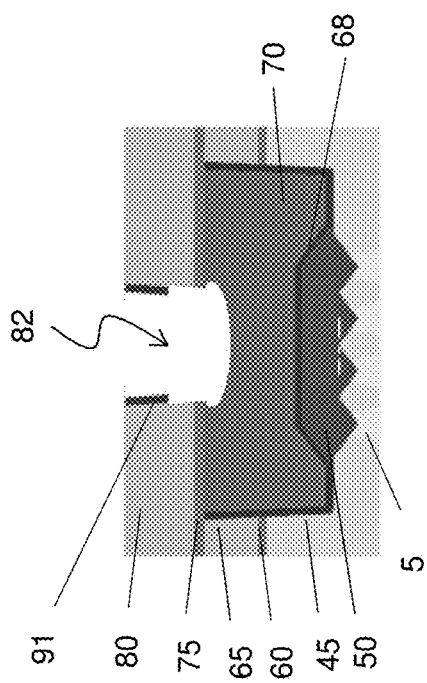

FIGS. 19A and 19B show cross sectional views of various stages of the sequential fabrication process of the semiconductor device shown in FIGS. 17A-17D according to an embodiment of the present disclosure.

Figure 19C:
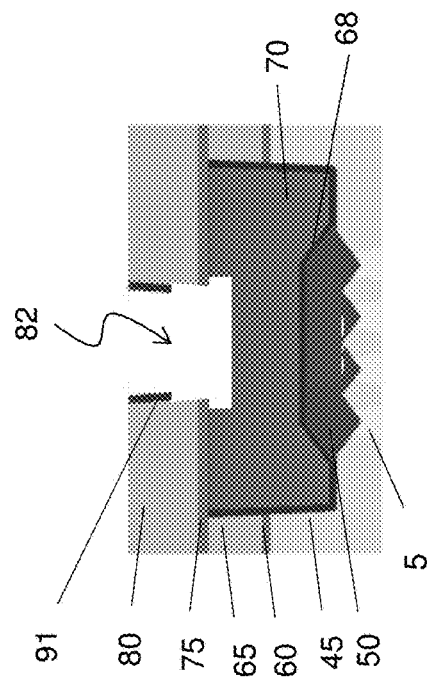

After the second contact liner layer 90 formed on horizontal surfaces of the third ILD layer 80 and the bottom of the contact hole 82 is removed as shown in FIG. 9B, the exposed upper portion of the source/drain contacts 70 is etched to form a recess. The etching is one or more of plasma dry etching operation and/or wet etching operations in some embodiments. In some embodiments, the bottom of the recess has an arc shape as shown in FIG. 19A. In other embodiments, the recess has a rectangular or a trapezoidal shape as shown in FIG. 19C. In some embodiments, isotropic etching, such as wet etching, is performed to form the recess. After the recess is formed, similar to the operations explained with respect to FIG. 9C, one or more conductive material layers 100 are formed in the recessed contact hole 82 and the third ILD layer 80, as shown in FIG. 19B. Subsequently, the operations similar to the operations explained with respect to FIG. 9D are performed. In other embodiments, after the recess is formed, operations similar to the operations explained with respect to FIGS. 8E-8H are performed.

In the foregoing embodiments, any combination of the structures of the source/drain contacts (lower and upper), the doped or non-doped third ILD layer, the recesses, and/or the gate contact are possible.

In the foregoing embodiments, because no contact liner layer is formed between the source/drain contact and the upper contact, it is possible to reduce contact resistance between the source/drain contact (and/or the gate contact) and the upper contact. A liner layer is formed between the gate contact and the upper contact to enhance adhesiveness of the conductive material of the upper contact. Since the gate contact does not necessarily require a low contact resistance like the source/drain contact, a liner layer can be disposed between the gate contact and the upper contact. Further, the recess formed at the surface of the lower contact also reduces the contact resistance between the source/drain contact (and/or the gate contact) and the upper contact The various embodiments or examples described herein offer several advantages over the existing art. It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first source/drain structure is formed over a substrate, one or more first insulating layers are formed over the first source/drain structure, a first opening is formed in the one or more first insulating layers, the first opening is filled with a first conductive material to form a first lower contact in contact with the first source/drain structure, one or more second insulating layers are formed over the first lower contact, a second opening is formed in the one or more second insulating layers to at least partially expose the first lower contact, a first liner layer is formed on at least a part of an inner side face of the second opening, and the second opening is filled with a second conductive material to form a first upper contact in contact with the first lower contact without the first liner layer interposed between the first upper contact and the first lower contact. In one or more of the foregoing and the following embodiments, the first liner layer is made of one or more of Ti, TiN, Ta and TaN. In one or more of the foregoing and the following embodiments, the first liner layer is formed on an upper portion of the second opening and the first upper contact is in contact with the one or more second insulating layers at a lower portion of the second opening. In one or more of the foregoing and the following embodiments, the second conductive material is W or Co. In one or more of the foregoing and the following embodiments, the second conductive material is formed at a temperature in a range from 200° C. to 400° C. In one or more of the foregoing and the following embodiments, the first conductive material is Co, and the second conductive material is W. In one or more of the foregoing and the following embodiments, the one or more second insulating layers includes silicon oxide containing at least one of Ge and Sn. In one or more of the foregoing and the following embodiments, the first source/drain structure includes a semiconductor epitaxial layer formed on multiple fin structures. In one or more of the foregoing and the following embodiments, the one or more first insulating layers include a first etch stop layer made of a silicon nitride based material and a first interlayer dielectric layer made of a silicon oxide based material disposed on the first etch stop layer. In one or more of the foregoing and the following embodiments, the one or more second insulating layers include a second etch stop layer made of a silicon nitride based material and a second interlayer dielectric layer made of a silicon oxide based material disposed on the second etch stop layer. In one or more of the foregoing and the following embodiments, a first gate structure is formed over the substrate. The first gate structure includes a first gate electrode and first sidewall spacers disposed on opposing side faces of the first gate electrode. A third opening is formed in the one or more first insulating layers, the third opening is filled with the first conductive material to form a second lower contact in contact with the first gate electrode, a fourth opening is formed in the one or more second insulating layers to at least partially expose the second lower contact, a second liner layer is formed on at least a part of an inner side face of the fourth opening, and the fourth opening is filled with the second conductive material to form a second upper contact in contact with the second lower contact without the second liner layer interposed between the second upper contact and the second lower contact. In one or more of the foregoing and the following embodiments, after the first liner layer is formed, an upper surface of first lower contact is vertically recessed. In one or more of the foregoing and the following embodiments, the upper surface of first lower contact is horizontally recessed.

In accordance with another aspect of the present disclosure, in a method of manufacturing a semiconductor device, a lower contact embedded in one or more first insulating layers is formed, one or more second insulating layers are formed over the lower contact, an opening is formed in the one or more second insulating layers to at least partially expose the lower contact, a liner layer is formed on an upper surface of an uppermost layer of the one or more second insulating layers, an inner side face of the second opening and on the exposed lower contact, the liner layer formed on the upper surface of the uppermost layer of the one or more second insulating layers and on the exposed lower contact is removed, and the liner layer formed on the inner side face of the second opening is partially removed, such that the liner layer remains on an upper portion of the second opening, and the second opening is filled with a conductive material to form an upper contact in contact with the lower contact. In one or more of the foregoing and the following embodiments, the liner layer is formed in a non-conformal manner. In one or more of the foregoing and the following embodiments, the upper portion is 10% to 90% of a depth of the second opening measured from a top of the second opening. In one or more of the foregoing and the following embodiments, the liner layer is made of TiN. In one or more of the foregoing and the following embodiments, a thickness of the liner layer is in a range from 0.1 nm to 5 nm. In one or more of the foregoing and the following embodiments, the conductive material is W or Co. In one or more of the foregoing and the following embodiments, the conductive material is formed at a temperature in a range from 200° C. to 400° C. In one or more of the foregoing and the following embodiments, after the liner layer is formed, an upper surface of the lower contact is vertically recessed. In one or more of the foregoing and the following embodiments, the upper surface of the lower contact is horizontally recessed.

In accordance with another aspect of the present disclosure in a method of manufacturing a semiconductor device, a source/drain structure is formed over a substrate, a gate electrode is formed adjacent to the source/drain structure, one or more first insulating layers are formed over the source/drain structure and the gate electrode, a first opening is formed in the one or more first insulating layers, the first opening is filled with a first conductive material to form a first lower contact in contact with the first source/drain structure, one or more second insulating layers are formed over the first lower contact, a second opening is formed in the one or more second insulating layers to at least partially expose the first lower contact, a first liner layer is formed on at least a part of an inner side face of the second opening, the second opening is filled with a second conductive material to form a first upper contact in contact with the first lower contact without the first liner layer interposed between the first upper contact and the first lower contact, a third opening is formed in the one or more first insulating layer and the one or more second insulating layer to at least partially expose the gate electrode, a second liner layer is formed on an inner side face of the third opening and on the exposed gate electrode, and the third opening is filled with a third conductive material to form a second upper contact in contact with the gate electrode with interposing the second liner layer. In one or more of the foregoing and the following embodiments, the second conductive layer and the third conductive layer are made of a same material, and formed at a same time. In one or more of the foregoing and the following embodiments, the first liner layer is formed on an upper portion of the second opening and the first upper contact is in contact with the one or more second insulating layers at a lower portion of the second opening.

In accordance with another aspect of the present disclosure, in a method of manufacturing a semiconductor device, a first gate structure and a second gate structure are formed over a substrate. The first gate structure includes a first gate electrode and first sidewall spacers disposed on both side faces of the first gate electrode, and the second gate structure includes a second gate electrode and second sidewall spacers disposed on both side faces of the second gate electrode. A first source/drain region is formed in an area between the first gate structure and the second gate structure, a first insulating layer is formed over the first source/drain region and between the first gate structure and the second gate structure, a first opening is formed in the first insulating layer, the first opening is filled with a first conductive material to form a lower contact in contact with the first source/drain region, a second insulating layer is formed over the lower contact, a second opening is formed in the second insulating layer to at least partially expose the lower contact, a liner layer is formed on inner side faces of the second opening, and the second opening is filled with a second conductive material to form an upper contact in contact with the lower contact without the liner layer interposed between the upper contact and the lower contact. In one or more of the foregoing and the following embodiments, the liner layer is made of one or more of Ti, TiN, Ta and TaN. In one or more of the foregoing and the following embodiments, germanium is introduced into the second insulating layer. In one or more of the foregoing and the following embodiments, after the second opening is formed, an upper portion of the lower contact includes a vertical recess. In one or more of the foregoing and the following embodiments, a depth of the vertical recess is in a range from 0.1 nm to 20 nm. In one or more of the foregoing and the following embodiments, after the second opening is formed, the upper portion of the lower contact includes horizontal recesses. In one or more of the foregoing and the following embodiments, a width of one of the horizontal recesses is in a range from 0.1 nm to 20 nm. In one or more of the foregoing and the following embodiments, after the second opening is formed, the upper portion of the lower contact includes no horizontal recess. In one or more of the foregoing and the following embodiments, the liner layer is formed on an upper portion of the second opening and the upper contact is in contact with the second insulating layer at a lower portion of the second opening. In one or more of the foregoing and the following embodiments, the first conductive material is Co, and the second conductive material is W.

In accordance with another aspect of the present disclosure, in a method of manufacturing a semiconductor device, a first source/drain structure is formed over a substrate, a first insulating layer is formed over the first source/drain structure, a first opening is formed in the first insulating layer, the first opening is filled with a first conductive material to form a first lower contact in contact with the first source/drain structure, a second insulating layer is formed over the first lower contact, a second opening is formed in the second insulating layer to at least partially expose the first lower contact, a first liner layer is formed in the second opening, a bottom of the first liner layer is removed in the second opening to expose a surface of the first lower contact, a tungsten layer is formed in the second opening in contact with the exposed surface of the first lower contact, ions of Ge are implanted into the second insulating layer, a metal layer is formed over the Ge implanted second insulating layer and the tungsten layer, and a planarization operation is performed on the metal layer to form an upper contact.

In accordance with one aspect of the present disclosure, a semiconductor device includes a gate electrode, a source/drain structure, a lower contact contacting either of the gate electrode or the source/drain region, an upper contact disposed in an opening formed in an interlayer dielectric (ILD) layer and in direct contact with the lower contact, and a liner layer disposed between the upper contact and the ILD layer. The liner layer is disposed on an upper portion of the opening and the upper contact is in contact with the ILD layer at a lower portion of the opening. In one or more of the foregoing and the following embodiments, the liner layer is made of TiN. In one or more of the foregoing and the following embodiments, a thickness of the liner layer is in a range from 0.1 nm to 5 nm. In one or more of the foregoing and the following embodiments, the thickness of the liner layer is not uniform. In one or more of the foregoing and the following embodiments, the thickness of the liner layer decreases from a top to a bottom of the liner layer. In one or more of the foregoing and the following embodiments, the lower contact includes Co, and the upper contact includes W. In one or more of the foregoing and the following embodiments, the upper portion is 10% to 90% of a depth of the opening measured from a top of the opening. In one or more of the foregoing and the following embodiments, the first source/drain structure includes a semiconductor epitaxial layer formed on multiple fin structures. In one or more of the foregoing and the following embodiments, the gate electrode extends in a first direction, and a width of the source/drain epitaxial layer is smaller than a width of the lower contact in the first direction. In one or more of the foregoing and the following embodiments, the gate electrode extends in a first direction, and a width of the lower contact is greater than a width of the upper contact in the first direction.

In accordance with another aspect of the present disclosure, a semiconductor device includes a gate electrode, a source/drain structure, a lower contact disposed in an first interlayer dielectric layer (ILD) and contacting the source/drain region, an upper contact contacting the lower contact and disposed in an opening formed in a second ILD layer disposed over the first ILD layer, a gate contact contacting the gate electrode and disposed in the first and second ILD layers, a first liner layer formed between the upper contact and the second ILD layer, and a second liner layer formed between the gate contact and the gate electrode. The upper contact is in direct contact with the lower contact without the first liner layer between the upper contact and the lower contact. In one or more of the foregoing and the following embodiments, each of the first and second liner layers is made of one or more of Ti, TiN, Ta and TaN. In one or more of the foregoing and the following embodiments, a thickness of each of the first and second liner layers is in a range from 0.1 nm to 5 nm. In one or more of the foregoing and the following embodiments, the first liner layer is formed on an upper portion of the opening and the upper contact is in contact with the ILD layer at a lower portion of the opening. In one or more of the foregoing and the following embodiments, the thickness of the first liner layer is not uniform. In one or more of the foregoing and the following embodiments, the thickness of the first liner layer decreases from a top to a bottom of the liner layer. In one or more of the foregoing and the following embodiments, the upper portion is 10% to 90% of a depth of the opening measured from a top of the opening. In one or more of the foregoing and the following embodiments, the first source/drain structure includes a semiconductor epitaxial layer formed on multiple fin structures.

In accordance with another aspect of the present disclosure, a semiconductor device includes a lower contact disposed in a first interlayer dielectric layer, a first liner layer disposed between the lower contact and the first ILD layer, an upper contact disposed in an opening formed in a second ILD layer and in direct contact with the lower contact, and a second liner layer formed between the upper contact and the second ILD layer. The liner layer is formed on an upper portion of the opening and the upper contact is in contact with the ILD layer at a lower portion of the opening. In one or more of the foregoing and the following embodiments, the upper portion is 5% to 95% of a depth of the opening measured from a top of the opening.

In accordance with another aspect of the present disclosure, a semiconductor device includes a gate electrode, a source/drain region, a lower contact contacting either of the gate electrode or the source/drain region, an upper contact formed in an interlayer dielectric (ILD) layer and is in direct contact with the lower contact, and a liner layer formed between the upper contact and the ILD layer. In one or more of the foregoing and the following embodiments, the liner layer is made of TiN. In one or more of the foregoing and the following embodiments, the ILD layer includes silicon dioxide containing Ge. In one or more of the foregoing and the following embodiments, an upper portion of the lower contact includes a vertical recess, into which the upper contact penetrates. In one or more of the foregoing and the following embodiments, a depth of the vertical recess is in a range from 0.1 nm to 20 nm. In one or more of the foregoing and the following embodiments, the upper portion of the lower contact includes horizontal recesses, into which the upper contact penetrates. In one or more of the foregoing and the following embodiments, a width of one of the horizontal recesses is in a range from 0.1 nm to 20 nm. In one or more of the foregoing and the following embodiments, the upper portion of the lower contact includes no horizontal recess. In one or more of the foregoing and the following embodiments, the liner layer is formed on an upper portion of the second opening and the upper contact is in contact with the one or more second insulating layers at a lower portion of the second opening. In one or more of the foregoing and the following embodiments, the first conductive material is Co, and the second conductive material is W.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first source/drain structure over a substrate;
   forming one or more first insulating layers over the first source/drain structure;
   forming a first opening in the one or more first insulating layers;
   filling the first opening with a first conductive material to form a first lower contact in contact with the first source/drain structure;
   forming one or more second insulating layers over the first lower contact;
   forming a second opening in the one or more second insulating layers to at least partially expose the first lower contact;
   forming a first liner layer on at least a part of an inner side face of the second opening; and
   filling the second opening with a second conductive material to form a first upper contact in contact with the first lower contact without the first liner layer interposed between the first upper contact and the first lower contact.

2. The method of claim 1, wherein the first liner layer is made of one or more of Ti, Ti N, Ta and TaN.

3. The method of claim 1, wherein the first liner layer is formed on an upper portion of the second opening and the first upper contact is in contact with the one or more second insulating layers at a lower portion of the second opening.

4. The method of claim 1, wherein the second conductive material is W or Co.

5. The method of claim 4, wherein the second conductive material is formed at a temperature in a range from 200° C. to 400° C.

6. The method of claim 1, wherein the first conductive material is Co, and the second conductive material is W.

7. The method of claim 1, wherein the one or more second insulating layers includes silicon oxide containing at least one of Ge and Sn.

8. The method of claim 1, wherein the one or more first insulating layers include a first etch stop layer made of a silicon nitride based material and a first interlayer dielectric layer made of a silicon oxide based material disposed on the first etch stop layer.

9. The method of claim 8, wherein the one or more second insulating layers include a second etch stop layer made of a silicon nitride based material and a second interlayer dielectric layer made of a silicon oxide based material disposed on the second etch stop layer.

10. The method of claim 1, further comprising:
    forming a first gate structure over the substrate, the first gate structure including a first gate electrode and first sidewall spacers disposed on opposing side faces of the first gate electrode;
    forming a third opening in the one or more first insulating layers;
    filling the third opening with the first conductive material to form a second lower contact in contact with the first gate electrode;
    forming a fourth opening in the one or more second insulating layers to at least partially expose the second lower contact;
    forming a second liner layer on at least a part of an inner side face of the fourth opening; and
    filling the fourth opening with the second conductive material to form a second upper contact in contact with the second lower contact without the second liner layer interposed between the second upper contact and the second lower contact.

11. A method of manufacturing a semiconductor device, the method comprising:
    forming a lower contact embedded in one or more first insulating layers;
    forming one or more second insulating layers over the lower contact;
    forming an opening in the one or more second insulating layers to at least partially expose the lower contact;
    forming a liner layer on an upper surface of an uppermost layer of the one or more second insulating layers, an inner side face of the second opening and on the exposed lower contact;
    removing the liner layer formed on the upper surface of the uppermost layer of the one or more second insulating layers and on the exposed lower contact and partially removing the liner layer formed on the inner side face of the second opening such that the liner layer remains on an upper portion of the second opening; and
    filling the second opening with a conductive material to form an upper contact in contact with the lower contact.

12. The method of claim 11, wherein the liner layer is formed in non-conformal manner.

13. The method of claim 11, wherein the upper portion is 10% to 90% of a depth of the second opening measured from a top of the second opening.

14. The method of claim 11, wherein the liner layer is made of TiN.

15. The method of claim 11, wherein a thickness of the liner layer is in a range from 0.1 nm to 5 nm.

16. The method of claim 11, wherein, after the liner layer is formed, an upper surface of the lower contact is vertically recessed.

17. The method of claim 16, wherein the upper surface of the lower contact is horizontally recessed.

18. A method of manufacturing a semiconductor device, the method forming a source/drain structure over a substrate;
- forming a gate electrode adjacent to the source/drain structure;
- forming one or more first insulating layers over the source/drain structure and the gate electrode;
- forming a first opening in the one or more first insulating layers;
- filling the first opening by a first conductive material to form a first lower contact in contact with the first source/drain structure;
- forming one or more second insulating layers over the first lower contact;
- forming a second opening in the one or more second insulating layers to at least partially expose the first lower contact;
- forming a first liner layer on at least a part of an inner side face of the second opening;
- filling the second opening by a second conductive material to form a first upper contact in contact with the first lower contact without interposing the first liner layer;
- forming a third opening in the one or more first insulating layer and the one or more second insulating layer to at least partially expose the gate electrode;
- forming a second liner layer on an inner side face of the third opening and on the exposed gate electrode; and
- filling the third opening by a third conductive material to form a second upper contact in contact with the gate electrode with interposing the second liner layer.

19. The method of claim 18, wherein the second conductive layer and the third conductive layer are made of a same material, and formed at a same time.

20. The method of claim 18, wherein the first liner layer is formed on an upper portion of the second opening and the first upper contact is in contact with the one or more second insulating layers at a lower portion of the second opening.

* * * * *